(12) United States Patent
Kalechofsky

(10) Patent No.: US 9,176,208 B2
(45) Date of Patent: Nov. 3, 2015

(54) TECHNIQUES, SYSTEMS AND MACHINE READABLE PROGRAMS FOR MAGNETIC RESONANCE

(71) Applicant: Millikelvin Technologies LLC, Braintree, MA (US)

(72) Inventor: Neal Kalechofsky, Stow, MA (US)

(73) Assignee: MILLIKELVIN TECHNOLOGIES LLC, Braintree, MA (US)

( * ) Notice: Subject to any disclaimer, the term of this patent is extended or adjusted under 35 U.S.C. 154(b) by 0 days.

(21) Appl. No.: 14/519,848

(22) Filed: Oct. 21, 2014

(65) Prior Publication Data

US 2015/0035532 A1 Feb. 5, 2015

Related U.S. Application Data

(63) Continuation of application No. 14/210,389, filed on Mar. 13, 2014.

(60) Provisional application No. 61/802,315, filed on Mar. 15, 2013.

(51) Int. Cl.
| | |
|---|---|
| *G01R 33/483* | (2006.01) |
| *G01R 33/36* | (2006.01) |
| *G01R 33/56* | (2006.01) |
| *G01R 33/561* | (2006.01) |
| *G01R 33/385* | (2006.01) |

(52) U.S. Cl.
CPC .............. *G01R 33/483* (2013.01); *G01R 33/36* (2013.01); *G01R 33/385* (2013.01); *G01R 33/56* (2013.01); *G01R 33/561* (2013.01); *G01R 33/5601* (2013.01); *G01R 33/5607* (2013.01)

(58) Field of Classification Search
USPC ........... 600/410, 411, 419; 324/307, 309, 319
See application file for complete search history.

(56) References Cited

U.S. PATENT DOCUMENTS

| | | | |
|---|---|---|---|
| 3,792,346 | A | 2/1974 | Gibby et al. |
| 5,345,174 | A | 9/1994 | Kimmich et al. |
| 5,789,921 | A | 8/1998 | Albert et al. |
| 6,241,966 | B1 | 6/2001 | Albert et al. |
| 6,426,058 | B1 | 7/2002 | Pines et al. |
| 6,453,188 | B1 | 9/2002 | Ardenkjaer-Larsen et al. |
| 6,651,459 | B2 | 11/2003 | Kalechofsky |
| 7,053,611 | B2 | 5/2006 | Freedman |
| 7,199,584 | B2 | 4/2007 | Meriles |
| 7,372,274 | B2 | 5/2008 | Ardenkjaer-Larsen et al. |

(Continued)

FOREIGN PATENT DOCUMENTS

| | | |
|---|---|---|
| RU | 2186405 C2 | 7/2002 |
| RU | 2377609 C2 | 12/2009 |

(Continued)

OTHER PUBLICATIONS

Yukalov, VI. Nuclear Spin Superradiance. eMagRes. (2002).

(Continued)

*Primary Examiner* — Unsu Jung
*Assistant Examiner* — Joseph Santos
(74) *Attorney, Agent, or Firm* — Brian R. Pollack; Day Pitney LLP

(57) ABSTRACT

The present disclosure provides various methods and systems for performing magnetic resonance studies. In accordance with many embodiments, image or other information of interest is derived from super radiant pulses.

29 Claims, 11 Drawing Sheets

Example — Simulation Of A Subject Inside A FEC Coil With SSR Volume Included Next To Him. The FEC Electonics Can Be Located Outside The MR Suit

(56) References Cited

U.S. PATENT DOCUMENTS

| | | |
|---|---|---|
| 2006/0290350 A1 | 12/2006 | Hursan et al. |
| 2007/0249929 A1 | 10/2007 | Jeong et al. |
| 2010/0090693 A1 | 4/2010 | Wald et al. |
| 2010/0256477 A1 | 10/2010 | Harvey et al. |
| 2010/0327866 A1 | 12/2010 | Albu et al. |
| 2011/0101979 A1 | 5/2011 | Wiesinger et al. |
| 2011/0187366 A1 | 8/2011 | Grodzki |
| 2012/0095324 A1 | 4/2012 | Schmidt |
| 2012/0229136 A1 | 9/2012 | Stemmer |
| 2013/0154643 A1 | 6/2013 | Kalechofsky |
| 2013/0265048 A1 | 10/2013 | Kalechofsky |
| 2014/0247047 A1 | 9/2014 | Kalechofsky |
| 2014/0266197 A1 | 9/2014 | Kalechofsky |
| 2014/0285191 A1 | 9/2014 | Kalechofsky |
| 2014/0285192 A1 | 9/2014 | Kalechofsky |

FOREIGN PATENT DOCUMENTS

| | | |
|---|---|---|
| RU | 2386140 C2 | 4/2010 |
| RU | 2411528 C2 | 2/2011 |
| SU | 1702271 A1 | 12/1991 |
| WO | 9737239 A1 | 10/1997 |
| WO | 2007002678 A2 | 1/2007 |
| WO | 2009018088 A2 | 2/2009 |
| WO | 2011018719 A1 | 2/2011 |

OTHER PUBLICATIONS

Notification of Transmittal of International Search Report and Written Opinion dated Aug. 7, 2014, International Search Report dated Aug. 7, 2014, and Written Opinion dated Aug. 7, 2014 for PCT/US2014/028343, 6 pages.

International Search Report dated Oct. 2, 2013 for PCT/US2013/049014, 2 pages.

Notification of Transmittal of International Search Report and Written Opinion dated Jul. 1, 2014, International Search Report dated Jul. 11, 2014, and Written Opinion dated Jul. 11, 2014 for PCT/US2014/026829, 6 pages.

International Search Report dated Sep. 25, 2014 for PCT/US2014/026862, 2 pages.

USPTO Non-Final Office Action issued in related U.S. Appl. No. 13/623,759, May 10, 2013.

USPTO Non-Final Office Action issued in related U.S. Appl. No. 13/763,967, May 14, 2013.

USPTO Non-Final Office Action issued in related U.S. Appl. No. 14/188,410, Jul. 30, 2014.

International Search Report in corresponding international application PCT/US2012/030384, mailed Jun. 28, 2012.

Notification of Transmittal of International Search Report and Written Opinion dated Sep. 25, 2014, International Search Report dated Sep. 25, 2014, and Written Opinion dated Sep. 25, 2014 for PCT/US2014/026862, 7 pages.

FIGURE 1 Example - Under SR conditions inverted magnetization returns to equilibrium in time << T1 and produces a pulse of transverse magnetization Mxy (green line). Red line shows changes in Mz during pulse Example – Simulation Of A Subject Inside A FEC Coil With SSR Volume Included Next To Him. The FEC Electonics Can Be Located Outside The MR Suit FIGURE 3
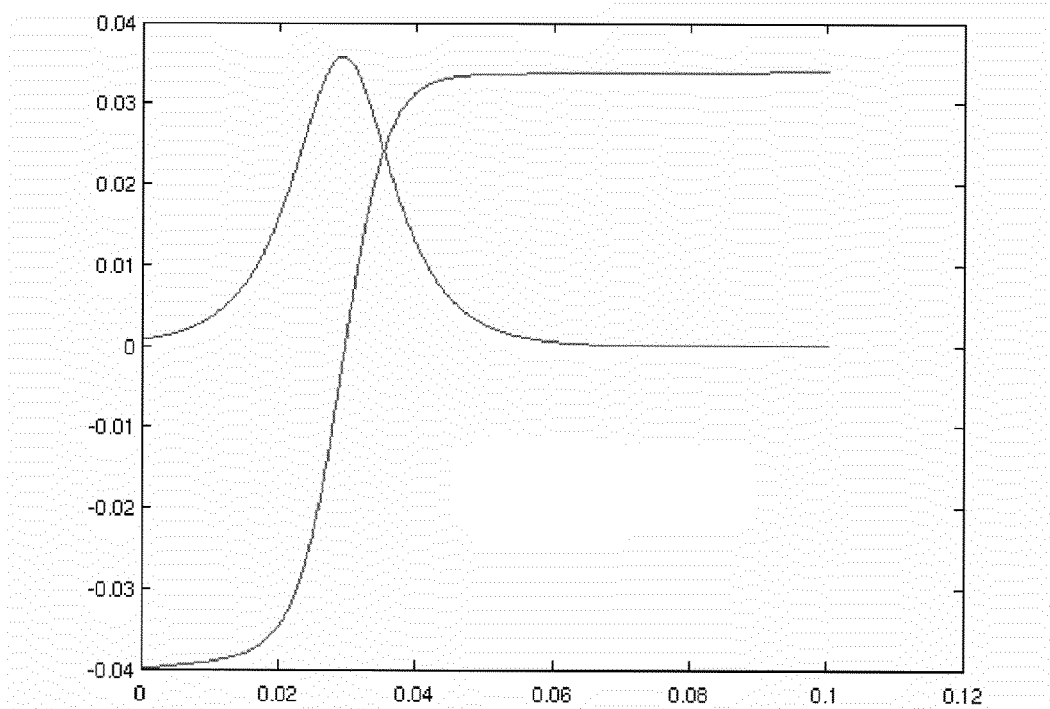
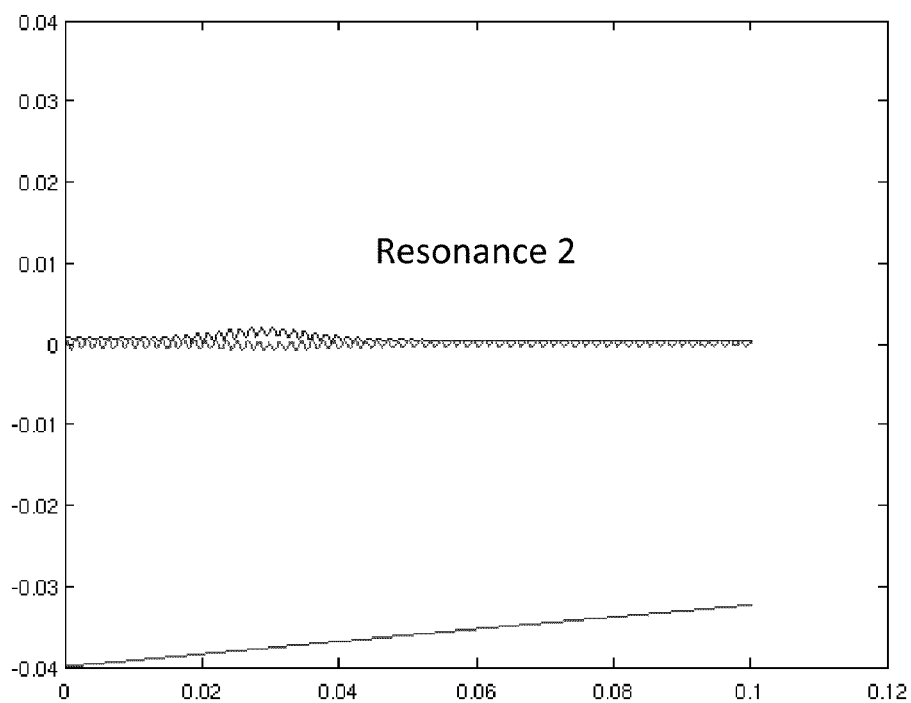

TECHNIQUES, SYSTEMS AND MACHINE READABLE PROGRAMS FOR MAGNETIC RESONANCE

CROSS-REFERENCE TO RELATED APPLICATIONS

This application claims the benefit of priority to and is a continuation of U.S. patent application Ser. No. 14/210,389, filed Mar. 13, 2014 and published as US20140285191, which in turn claims the benefit of priority to U.S. Provisional Patent Application Ser. No. 61/802,315, filed Mar. 15, 2013. This application is also related to U.S. patent application Ser. No. 13/844,446, filed Mar. 15, 2013, published as US2013/0265048, which in turn claims the benefit of priority to and is a continuation in part of U.S. patent application No. 13/623,759 filed Sep. 20, 2012, published as US2013/0253308, which in turn claims the benefit of priority of and is a continuation of International Patent Application No. PCT/US2012/30384, filed Mar. 23, 2012, published as WO 2012/129512, which in turn claims the benefit of priority to U.S. Provisional Patent Application Ser. No. 61/466,500, filed Mar. 23, 2011 and U.S. Provisional Patent Application Ser. No. 61/522,076, filed Aug. 10, 2011. The disclosure of each of the aforementioned patent applications is incorporated by reference herein in its entirety.

BACKGROUND OF THE DISCLOSURE

1. Field of the Disclosure

The present disclosure relates to methods for detecting and imaging molecules that are present in a non living sample or a living organism, and in particular, detecting and imaging molecules, or compositions of molecules, that are present in low concentrations in the living organism. Embodiments of the present disclosure employ Magnetic Resonance Spectroscopic Imaging (MRSI). Embodiments of the present disclosure do not require, i.e., are free of, the use of radioactive isotopes.

2. Description of Related Art

Clinical molecular imaging has the potential to revolutionize current diagnostic and therapeutic practice by enabling in vivo detection of molecules that are biomarkers for various diseases or biological processes of interest. For example, altered levels of glucose metabolism are known to be associated with the presence of various cancers and other disease states; indeed, it is detection of in vivo glucose metabolism that forms the basis of fludeoxyglucose F 18, also known as 2-deoxy-2-[$^{18}$F]fluorodeoxyglucose (hereinafter "F$^{18}$DG") Positron Emission Tomography (hereinafter "PET"). In vivo choline detection is also under study as a method of determining tumor response to chemotherapy and other forms of treatment. Other molecules of interest for cancer diagnosis/therapeutic monitoring include creatine, citrate and N-acetyl aspartate.

Additionally, complex constructs consisting of non-biological molecules such as perfluorocarbon nanoparticles decorated with surface ligands designed to specifically bind to a desired biological site have been used as biomarkers in in vivo imaging. The challenge to molecular imaging using MRSI is that in vivo concentration of target molecules (both endogenous and exogenous) is so small that detection is very difficult or even impossible under clinically feasible conditions (which conditions include using MRI scanners with reasonable field strength and reasonable time periods for the clinical scan of the sample). As a consequence, radioactive tagging of biomarker molecules using F$^{18}$ and other radionuclides, has been used as a source of detectable signal using in vivo PET.

Fluorinated glucose, which is transported into cells via glycolysis, is a case in point. Cancer cells are known to have higher glycolytic rates than healthy tissue. Once in the cell, fluorinated glucose is metabolized via hexokinase to fluorinated glucose-6-phosphate and other metabolites. The fluorinated molecules are transported out of the cell at rates much lower than the metabolites stemming from ordinary (non-fluorinated) glucose metabolic pathways. As a result, the fluorinated glucose-6-phosphate can be considered "trapped" in the cell for extended periods of time (longer than 1 hour). Hence the expectation is that cell masses showing higher than background concentrations of fluorinated glucose can be quantitatively evaluated for likelihood of being cancerous.

PET F$^{18}$DG has emerged over the last 30 years as a reliable technique for identifying the presence of cancerous tissue, and more recently PET F$^{18}$DG has been employed for other diagnostic purposes, including the evaluation and management of patients with suspected ischemic left ventricular systolic dysfunction, and the evaluation and management of patients with certain neurological indications (such as dementia and seizure). However, the approach has the considerable drawback of subjecting the patient to a radioactive burden, allowing this method to be used only intermittently and in circumstances where the dose related radiation risks are outweighed by the benefits of the diagnostic information yielded by the PET scan. This risk-benefit analysis must be determined (by the treating physician and patient) to favor imaging, which is usually only in the case where there is known or very high-suspicion of significant pathology such as after a positive identification for cancer has already been made. In addition, the costs and risks to staff and the environment when manufacturing, distributing and employing radioactive isotopes are high.

Because the strength of the signal emitted by the radioactive isotope in F$^{18}$DG is large, very small doses of F$^{18}$DG are required for PET studies. By contrast F$^{19}$DG is non-radioactive and biologically identical to F$^{18}$DG, but under clinically safe dose levels research has suggested its key metabolite, intracellular F$^{19}$DG-6-phosphate, is available is at a very low concentrations below the threshold of detection by present day. MRSI methods and systems under clinically feasible conditions (reasonable MRI field strength and reasonable clinical scan times). As a result, while F$^{18}$DG is currently useful as a diagnostic imaging agent using PET, F$^{19}$DG has not been shown to be clinically useful as a diagnostic imaging agent using MRSI.

To date, translation of MRSI to clinical use has been hampered by the poor signal to noise ratio (SNR) of target molecules at low concentrations, as in the example above, and/or difficulty in obtaining spectral selectivity of target molecule(s). Though moderate increases to SNR are available through various engineering improvements (such as larger magnetic fields) none of these have the potential to enable detection of in vivo biomarkers such as those described above.

SUMMARY OF THE DISCLOSURE

Advantages of the present disclosure will be set forth in and become apparent from the description that follows. Additional advantages of the disclosure will be realized and attained by the methods and systems particularly pointed out in the written description and claims hereof, as well as from the appended drawings.

To achieve these and other advantages and in accordance with the purpose of the disclosure, as embodied herein, in one embodiment, the disclosure provides a method of performing a magnetic resonance protocol. The method includes providing a magnetic resonance device including (i) a main magnet for providing a background magnetic field along a first direction, (ii) at least one radio-frequency coil, and (iii) at least one gradient coil that can be controlled to define at least one region of interest. The method further includes introducing a sample or subject to be studied into the MR device, employing RF pulses to rotate the magnetization of at least one set of nuclei in the sample or subject, optionally then producing an image and/or obtaining spectroscopic information as a result of said pulses, and then inducing feedback between the nuclear magnetization of at least one set of nuclei within the sample or subject and at least one nearby resonant coil to cause at least one of (i) the vector direction of the nuclear magnetization of the at least one set of nuclei within the sample to rotate to a desired angle with respect to the direction of the background magnetic field and (ii) the precessional frequency of at least one set of nuclei within the sample to shift with respect to the precessional frequency of other nuclei in the sample.

The method further can include employing additional RF pulses and RF pulse detection schemes to obtain signals from the sample or subject with the at least one radio-frequency coil with the purpose of making an image and/or obtaining spectroscopic data or images. The method can further include repeating the above steps in order to improve image intensity, spectral resolution and the like. The method can still further include obtaining proton MR image data, either concurrently or sequentially with the above steps, so that any images produced by the above method may be co registered with anatomical MR data. The method can still further include employing a feedback enabled coil (FEC) and a Supplementary Spin Reservoir (SSR), described more fully below, as techniques for permitting feedback of nuclear magnetism to occur even under clinical MRI conditions where it normally would not. The method further includes optionally obtaining proton MR image data, either concurrently or sequentially with the above steps, so that any images produced by the above method may be co registered with anatomical MR data.

To achieve these and other advantages and in accordance with the purpose of the disclosure, as embodied herein, in one embodiment, the disclosure also provides a method of performing a magnetic resonance spectroscopy protocol. The method includes providing a magnetic resonance device including (i) a main magnet for providing a background magnetic field along a first direction, (ii) at least one radio-frequency coil and (iii) at least one gradient coil that can be controlled to define at least one region of interest. The method further includes introducing a sample or subject to be studied into the MR device, employing RF pulses to rotate the magnetization of at least one set of nuclei in the sample or subject. Optionally the gradient coil may be used to take signals from a defined region of interest or signals may be obtained from the entire FOV of the RF coil, as desired. The method further includes employing a feedback enabled coil (FEC) and a Supplementary Spin Reservoir (SSR), described more fully below, as techniques for enabling feedback of nuclear magnetism to occur even under clinical MRI conditions where it normally would not. The method further includes then inducing feedback between the nuclear magnetization of at least one set of nuclei within the sample or subject and at least one nearby resonant coil to cause the magnetization of at least one set of nuclei to be rotated to a new preferred angle with respect to the background magnetic field. This has the effect of creating a pulse of transverse magnetization that may be detected and processed by the MR device. The method further includes adjusting at least one of i) the gain and ii) the phase of the FEC coil, either before, during the rotation of the magnetization so as to suppress, highlight, or identify one set of nuclei within the sample or subject to the exclusion of others. The method further includes processing the pulse resulting from rotation of the magnetization for spectroscopic information, either in the time domain or in the Fourier Transform (frequency) domain. The method further includes optionally repeating the above steps in order to improve image intensity, spectral resolution etc. The method further includes optionally obtaining proton MR image data, either concurrently or sequentially with the above steps, so that any images produced by the above method may be co registered with anatomical MR data.

In some implementations, the above methods can further include processing information obtained from a plurality of pulses of RF magnetization to produce at least one of (i) an image, (ii) dynamic flow data, (iii) perfusion data, (iii) spectroscopic identity of chemical species, (iv) physiological data, or (v) metabolic data.

In further implementations, a coil designed to amplify feedback can be employed. The coil can additionally and optionally be made to permit manipulation of the phase angle of the feedback field. This coil is referred to in this document as a Feedback Enabled Coil (FEC). Examples of additional suitable coils can be found in U.S. Provisional Patent Application Ser. No. 61/882,430, filed Sep. 25, 2013, which is incorporated by reference herein in its entirety for any purpose whatsoever.

In further implementations, the method includes inserting a volume containing a plurality of molecules in the field of view (FOV) of either the resonant coil or the FEC. This volume, termed the Supplementary Spin Reservoir (SSR), permits the production of feedback even under relatively low field conditions of clinical MRI scanners. In addition, by selecting the molecule (or molecules) inside the SSR, the feedback field can be made to resonate at a desired frequency or set of frequencies.

In accordance with further aspects, the disclosure provides systems for performing a magnetic resonance protocol. The system can include a magnetic resonance device including (i) a main magnet for providing a background magnetic field along a first direction, (ii) at least one radio-frequency coil, and (iii) at least one gradient coil that can be controlled to define at least one region of interest. The system can further include means for defining a region of interest, means for introducing a sample or subject to be studied into the region of interest and means for inducing feedback between the nuclear magnetization of at least one set of nuclei within the sample and at least one nearby resonant coil to cause the vector direction of the nuclear magnetization of the at least one set of nuclei to rotate to a desired angle with respect to the first direction of the background magnetic field to generate at least one electromagnetic pulse of transverse magnetization $M_{XY}$. The method can still further include means for detecting pulse or pulses of rf magnetization with the at least one radio-frequency coil.

In some embodiments, at least one of (i) the at least one radio frequency coil and (ii) the at least one gradient coil can be a local coil. At least one of the at least one radio frequency coil and the at least one gradient coil can be integrated into the magnetic resonance system. The at least one radio frequency coil can be a whole body coil. The at least one radio frequency coil can be a whole body phased array transmit/receive coil system having a plurality of coils that can selectively transmit and receive rf pulses of transverse magnetization. The at least one radio frequency coil can be a local phased array transmit/receive coil system having a plurality of coils that can selectively transmit and receive rf pulses of transverse magnetization. At least one radio frequency coil can further include a plurality of local gradient coils for locally controlling the gradient magnetic field. The at least one gradient field coil can include a plurality of gradient field coils integrated into the magnetic resonance system, as well as one or more local gradient coils, if desired.

The disclosure further provides processor-readable computer programs stored on a tangible non-transient medium for operating a magnetic resonance protocol on a magnetic resonance device including, for example, (i) a main magnet for providing a background magnetic field along a first direction, (ii) at least one radio-frequency coil, and (iii) at least one gradient coil that can be controlled to define at least one region of interest. The program can include instructions to facilitate definition of a region of interest, instructions for inducing feedback between the nuclear magnetization of at least one set of nuclei within the sample and at least one nearby resonant coil to cause the vector direction of the nuclear magnetization of the at least one set of nuclei to rotate to a desired angle with respect to the first direction of the background magnetic field to generate at least one electromagnetic pulse of transverse magnetization $M_{XY}$, and instructions to facilitate processing signals received arising from the pulse of transverse magnetization with the at least one radio-frequency coil.

The computer program can further include instructions for processing information obtained from a plurality of pulses of transverse magnetization to produce at least one of (i) an image, (ii) dynamic flow data, (iii) perfusion data, (iii) spectroscopic identity of chemical species, (iv) physiological data, and (v) metabolic data. The program can further include instructions to induce feedback by substantially eliminating the presence of a gradient magnetic field in the at least one region of interest by controlling the at least one gradient coil. The region of interest can include at least one voxel, and the program can include instructions to cause the at least one gradient coil to apply a magnetic field gradient in at least one of three mutually orthogonal directions. The program can include instructions to induce feedback at least in part by selectively tuning the at least one rf coil to a predetermined resonant frequency. The program can similarly include instructions to cause the system to selectively and controllably apply a RF pulse to the sample in order to at least partially invert the nuclear magnetization of the at least one set of nuclei prior to inducing the feedback.

In some implementations, the computer program can include instructions to cause the magnetic resonance system to operate at least one radio frequency coil and at least one gradient coil that is a local coil. The computer program can include instructions to cause the magnetic resonance system to operate at least one radio frequency coil and at least one gradient coil that is integrated into the magnetic resonance system. The computer program can include instructions to operate a radio frequency coil that is a whole body phased array transmit/receive coil system having a plurality of coils that can selectively transmit and receive pulses of RF magnetization. If desired, the computer program can include instructions to operate a radio frequency coil that is a local phased array transmit/receive coil system having a plurality of coils that can selectively transmit and receive pulses of RF magnetization. The computer program can similarly include instructions to operate at least one radio frequency coil that further includes a plurality of local gradient coils for locally controlling the gradient magnetic field.

It is to be understood that the foregoing general description and the following detailed description are exemplary and are intended to provide further explanation of the disclosed embodiments. The accompanying drawings, which are incorporated in and constitute part of this specification, are included to illustrate and provide a further understanding of the disclosed methods and systems. Together with the description, the drawings serve to explain principles of the disclosure.

BRIEF DESCRIPTION OF THE DRAWINGS

FIG. 3 illustrates a Simulation of the effect of SR conditions Mz, Mxy dynamics for two resonances 10 ppm apart. Both resonances start completely inverted with $Mz_1=-Mz_1$ $Mz_2=-Mz_2$ and $Mxy_{1,2}=0$. Turning on SR conditions centered on resonance 1 causes it to rapidly return to equilibrium with its Mxy passing through 90 degrees at time t~20 msec. Resonance 2 remains almost completely inverted, with only a very small amount of transverse magnetization generated.

DETAILED DESCRIPTION OF PREFERRED EMBODIMENTS

Figure 1:
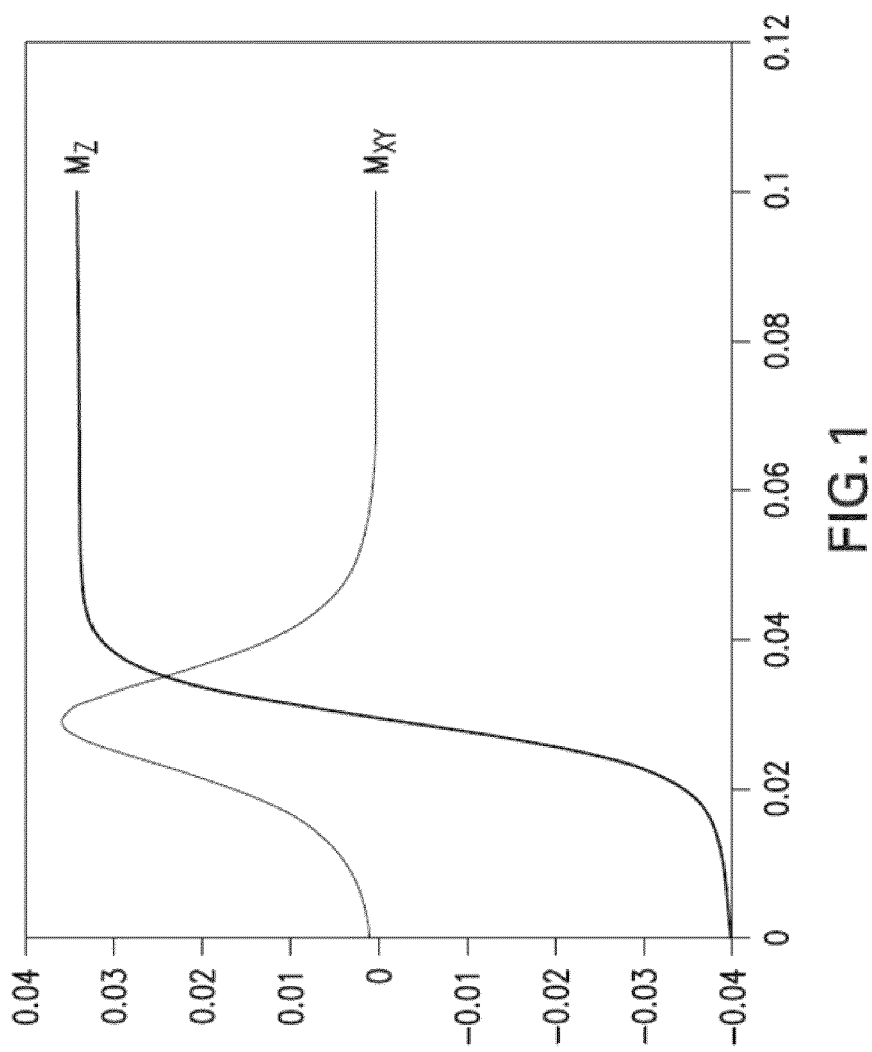
FIG. 1 illustrates a simulated SR pulse resulting from inverting the magnetization of a single ensemble of nuclei in accordance with the disclosure.

Reference will now be made in detail to the present preferred embodiments of the disclosure, examples of which are illustrated in the accompanying drawings. The methods and corresponding steps of the disclosed embodiments will be described in conjunction with the detailed description of the system.

Mathematical Description of Superradiance:

The equation of motion of the nuclear magnetization in an MR experiment in a homogenous field is $$\frac{d\vec{M}}{dt} = \gamma \vec{M} \times \vec{B} - \ddot{R}(\vec{M} - \vec{M}_o) \quad [1]$$

wherein M is the nuclear magnetization, B are the magnetic fields, and R is the relaxation matrix.

Transforming to a reference frame rotating with the rf field at frequency ω with:

$$M_z = m_z \quad M_\pm = e^{\pm j\omega t} m_\pm$$

$$B_\pm = B_{1\pm} e^{\pm j\omega t} \quad [2]$$

gives the Bloch equations in the rotating frame of the rf field:

$$\frac{dm_z}{dt} = j\gamma(m_+ B_{1-} - m_- B_{1+})/2 - (m_z - M_o)/T_1 \quad [3]$$

$$\frac{dm_\pm}{dt} = \mp j(\omega + \gamma B_z)m_\pm \pm j\gamma m_z B_{1\pm} - m_\pm/T_2$$

Wherein $T_1$ is the constant of exponential relaxation of the longitudinal (z) magnetization and $T_2$ is the exponential constant of relaxation of the transverse magnetization.

Defining $m_\pm \equiv m e^{\pm j\phi}$ will allow a separation of the Bloch equations into magnitude and phase for the transverse magnetization.

$$\frac{dm_\pm}{dt} = \frac{de^{\pm j\phi}m}{dt} \quad [4]$$

$$= \pm j m e^{\pm j\phi}\frac{d\phi}{dt} + e^{\pm j\phi}\frac{dm}{dt}$$

$$= \mp j(\omega + \gamma B_z)e^{\pm j\phi}m \pm j\gamma m_z B_{1\pm} - e^{\pm j\phi}m/T_2$$

$$= \pm j\frac{d\phi}{dt} + \frac{dm}{mdt}$$

$$= \mp j(\omega + \gamma B_z) \pm j\gamma m_z \frac{B_{1\pm}}{me^{\pm j\phi}} - 1/T_2$$

$$\frac{d\phi}{dt} = -(\omega + \gamma B_z) + \frac{\gamma m_z}{m}\text{Re}\{B_{1\pm} e^{\mp j\phi}\}$$

$$\frac{dm}{mdt} = \mp \frac{\gamma m_z}{m}\text{Im}\{B_{1\pm} e^{\mp j\phi}\} - 1/T_2$$

Wherein Re and Im refer to the real and imaginary parts.

Adding Feedback:

Now feedback may be added, so that:

$$B_{1\pm} = \beta e^{\pm j\alpha} m_\pm = \beta m e^{\pm j(\alpha+\phi)} \quad [5]$$

then from equations [3,4]:

$$\frac{dm_z}{dt} = \gamma \beta m^2 \sin\alpha - (m_z - M_o)/T_1 \quad [6]$$

$$\frac{d\phi}{dt} = -(\omega + \gamma B_z) + \gamma\beta m_z \cos\alpha$$

$$\frac{dm}{mdt} = -\gamma\beta m_z \sin\alpha - 1/T_2$$

Note that the second equation with cos α=0, suggests that the rf field frequency is locked to $B_z$. To see this, solve for φ.

$$\phi = -(\omega + \gamma B_z)t + \gamma\beta\cos\alpha\int m_z dt \text{ if } \cos\alpha = 0, \quad [7]$$

$$\phi = -(\omega + \gamma B_z)t$$

$$\therefore M_\pm = m e^{\pm j\omega t} e^{\pm j\phi} = m e^{\mp j\gamma B_z t}$$

$$B_\pm = \left\{\begin{matrix}\pm\\\mp\end{matrix}\right\} jm\beta e^{\mp j\gamma B_z t}$$

with the ±signs in the bracket corresponding to sin α=±1 and ω=−γ$B_z$. The ±j factor for $B_\pm$ indicates that the rf field must be phase shifted ±90° with respect to the magnetization If we write γβ$m_z$ sin α=$\tau_R$ where $\tau_R$ is known as the "superradiant" time it is clear from Equation 6 that where dm/dt=0 is where $\tau_R$=$T_2$. This also defines the ambient conditions for superradiance to occur; ie where $\tau_R$≤T2 the dynamics of the magnetization are dominated by superradiance rather than "ordinary" relaxation.

Differential Equation and Solution;

A differential equation may be developed from Equation. First make a substitution for d$m_z$/dt to obtain:

$$\frac{d}{dt}\frac{dm}{mdt} = -\gamma\beta\sin\alpha(\gamma\beta m^2\sin\alpha - (m_z - M_o)/T_1)$$

A solution may be obtained for a sufficiently long $T_1$, thus $$\frac{d}{dt}\frac{dm}{mdt} = -(\gamma\beta\sin\alpha m)^2 \quad [7]$$

Solution for m is given by μsech(μγβ sin α(t−$t_0$)) where μ and $t_0$ are constants to be determined. Verify:

$$\frac{d}{dt}\frac{d\mu\text{sech}(\gamma\beta\mu\sin\alpha(t-t_o))}{\mu\text{sech}(\gamma\beta\mu\sin\alpha(t-t_o))dt} =$$

$$\frac{d}{dt}\frac{[-\gamma\beta\sin\alpha\mu^2\tanh(\gamma\beta\mu\sin\alpha(t-t_o))\text{sech}(\gamma\beta\mu\sin\alpha(t-t_o))]}{\mu\text{sech}(\gamma\beta\mu\sin\alpha(t-t_o))} =$$

$$\frac{d[-\gamma\beta\sin\alpha\mu\tanh(\gamma\beta\mu\sin\alpha(t-t_o))]}{dt} =$$

$$-(\gamma\beta\mu\sin\alpha)^2\text{sech}^2(\gamma\beta\mu\sin\alpha(t-t_o)) = -(\gamma\beta\sin\alpha m)^2$$

Solution for $m_z$ may be developed from the third equation:

$$\frac{dm}{mdt} = -\gamma\beta m_z \sin\alpha - 1/T_2$$

$$\frac{dm}{mdt} = \frac{-\gamma\beta\sin\alpha\mu\mu\tanh(\gamma\beta\mu\sin\alpha(t-t_o))\text{sech}(\gamma\beta\mu\sin\alpha(t-t_o))}{\mu\text{sech}(\gamma\beta\mu\sin\alpha(t-t_o))}$$

$$= -\gamma\beta\sin\alpha\mu\tanh(\gamma\beta\mu\sin\alpha(t-t_o))$$

$$= -\gamma\beta\sin\alpha m_z - 1/T_2$$

$$m_z = \mu\tanh(\gamma\beta\mu\sin\alpha(t-t_o)) - 1/\gamma\beta\sin\alpha T_2$$

At time, t=0, we have the following $$m_z(0) = -\mu\tan h(\gamma\beta\mu\sin\alpha t_o) - 1/\gamma\beta\sin\alpha T_2$$

$$m(0) = \mu sech(\gamma\beta\mu\sin\alpha t_o) \quad [8]$$

Since the total magnetization at t=0 is equal to $M_0$, then $$M_o^2 = \mu^2 \text{sech}^2(\gamma\beta\mu\sin\alpha t_o) + \mu^2\tanh^2(\gamma\beta\mu\sin\alpha t_o) +$$
$$2\mu\tanh(\gamma\beta\mu\sin\alpha t_o)/\gamma\beta\sin\alpha T_2 + (1/\gamma\beta\sin\alpha T_2)^2$$

$$M_o^2 = \mu^2 + 2\mu\tanh(\gamma\beta\mu\sin\alpha t_o)/\gamma\beta\sin\alpha T_2 + (1/\gamma\beta\sin\alpha T_2)^2$$

$$\left[1-\left(\frac{\mu}{M_o}\right)^2 - \left(\frac{1}{\gamma\beta M_o\sin\alpha T_2}\right)^2\right]\frac{M_o}{2\mu}\gamma\beta M_o\sin\alpha T_2 = \tanh(\gamma\beta\mu\sin\alpha t_o)$$

Thus $\mu$ and $t_0$ may be dependent on each other. Using the expression for $m_z(0)$ from eq.[8] gives $$\left[1-\left(\frac{\mu}{M_o}\right)^2 - \left(\frac{1}{\gamma\beta M_o\sin\alpha T_2}\right)^2\right]\gamma\beta M_o\sin\alpha T_2 = \quad [9]$$

$$-2\left(\frac{m_z(0)}{M_o} + \frac{1}{\gamma\beta M_o\sin\alpha T_2}\right)$$

$$\gamma\beta M_o\sin\alpha T_2\left[\left(\frac{\mu}{M_o}\right)^2 - 1\right] = \frac{2m_z(0)}{M_o} + \frac{1}{\gamma\beta M_o\sin\alpha T_2}$$

$$\left(\frac{\mu}{M_o}\right)^2 = 1 + \frac{1}{\gamma\beta M_o\sin\alpha T_2}\left[\frac{2m_z(0)}{M_o} + \frac{1}{\gamma\beta M_o\sin\alpha T_2}\right]$$

To determine $t_0$ we can use the expression for m(0) from eq.[8] to give $$t_o = \frac{1}{\gamma\beta\mu|\sin\alpha|}\text{sech}^{-1}\left(\frac{m(0)}{\mu}\right) \quad [10]$$

where $$\text{sech}^{-1}(x) = \ln\left[\frac{1+\sqrt{1-x^2}}{x}\right] \text{ for } 0 < x \le 1 \quad [11]$$

Let the brackets with the plus-minus sign, $\{\pm\}$ define sgn (sin $\alpha$). Also define $$\tau_R \equiv 1/\gamma\beta M_o|\sin\alpha| \quad [12]$$
Thus $$\mu = M_o\sqrt{1\{\pm\}\frac{\tau_R}{T_2}\left[\frac{2m_z(0)}{M_o}\{\pm\}\frac{\tau_R}{T_2}\right]} \equiv M_o\frac{\tau_R}{\tau}$$

and thus $$\frac{1}{\tau} = \frac{1}{\tau_R}\sqrt{1\{\pm\}\frac{\tau_R}{T_2}\left[\frac{2m_z(0)}{M_o}\{\pm\}\frac{\tau_R}{T_2}\right]} \quad [13]$$

Therefore $$m_z(t) = \{\pm\}M_o[(\tau_R/\tau)\tanh((t-t_o)/\tau) - \tau_R/T_2] \quad [14]$$
$$m(t) = M_o(\tau_R/\tau)\text{sech}((t-t_o)/\tau)$$

with $t_0$ determined by m(0) or by $m_z(0)$ as $$m_z(0) = \{\pm\}M_o[(\tau_R/\tau)\tanh((-t_o)/\tau) - \tau_R/T_2] \quad [15]$$

$$\left[\frac{\tau_R}{T_2}\{\pm\}\frac{m_z(0)}{M_o}\right]\frac{\tau}{\tau_R} = -\tanh(t_o/\tau) = \frac{1-e^{2t_o/\tau}}{1+e^{2t_o/\tau}}$$

$$e^{2t_o/\tau} = \frac{1-\left[\frac{\tau_R}{T_2}\{\pm\}\frac{m_z(0)}{M_o}\right]\frac{\tau}{\tau_R}}{1+\left[\frac{\tau_R}{T_2}\{\pm\}\frac{m_z(0)}{M_o}\right]\frac{\tau}{\tau_R}}$$

$$t_o = \frac{\tau}{2}\ln\frac{1-\left[\frac{\tau_R}{T_2}\{\pm\}\frac{m_z(0)}{M_o}\right]\frac{\tau}{\tau_R}}{1+\left[\frac{\tau_R}{T_2}\{\pm\}\frac{m_z(0)}{M_o}\right]\frac{\tau}{\tau_R}}$$

and $$t_o = \tau\,\text{sech}^{-1}\left(\frac{\tau}{\tau_R}\frac{m(0)}{M_o}\right) \quad [16]$$

The phase of the transverse magnetization is given by $$\phi(t) + \omega t = -\gamma B_z t + \gamma\beta\cos\alpha\int m_z dt \quad [17]$$

$$\phi(t) + \omega t =$$
$$-\gamma B_z t\{\pm\}M_o\gamma\beta\cos\alpha\int[(\tau_R/\tau)\tanh((t-t_o)/\tau) - \tau_R/T_2]dt$$

$$\phi(t) + \omega t = -\gamma B_z t\{\pm\}\frac{\cos\alpha}{|\sin\alpha|}[\ln\cosh((t-t_o)/\tau) - t/T_2 + C]$$

$$\phi(0) = \{\pm\}\frac{\cos\alpha}{|\sin\alpha|}[\ln\cosh(t_o/\tau) + C] = 0$$

$$C = -\ln\cosh(t_o/\tau)$$

$$\phi(t) + \omega t = -\gamma B_z t\{\pm\}\frac{\cos\alpha}{|\sin\alpha|}\left[\ln\frac{\cosh((t-t_o)/\tau)}{\cosh(t_o/\tau)} - t/T_2\right]$$

The frequency of the magnetization is given by the derivative.

$$\omega_o \equiv \frac{d(\phi(t)+\omega t)}{dt} = -\gamma B_z\{\pm\}\frac{\cos\alpha}{|\sin\alpha|}[\tanh((t-t_o)/\tau)/\tau - 1/T_2] \quad [18]$$

Thus the frequency can change as the phase is adjusted.

SUMMARY

Under SR conditions ($\tau_R \le T2$) the equation of motion of the magnetization for the longitudinal and transverse nuclear magnetizations are:

$$m_z(t) = \{\pm\}M_0[(\tau_R/\tau)\tan h((t-t_0)/\tau) - \tau_R/T_2]$$

$$m(t) = M_0(\tau_R/\tau)sech((t-t_0)/\tau)$$

This produces a pulse of magnetization which peaks at time $t_0$ (FIG. 1):

$$t_o = \frac{\tau}{2}\ln\left[\frac{\frac{\tau_R}{\tau} - \frac{\tau_R}{T_2}\{\mp\}\frac{m_z(0)}{M_o}}{\frac{\tau_R}{\tau} + \frac{\tau_R}{T_2}\{\pm\}\frac{m_z(0)}{M_o}}\right] = \tau\,\text{sech}^{-1}\left[\frac{\tau}{\tau_R}\frac{m(0)}{M_o}\right] \quad [19]$$

The phase of the transverse magnetization $$\omega_o = -\gamma B_z\{\pm\}\frac{\cos\alpha}{|\sin\alpha|}[\tanh((t-t_o)/\tau)/\tau - 1/T_2] \quad [20]$$

As $T_2 \to \infty$, $$m_z(t) = \{\pm\}M_o\tanh((t-t_o)/\tau_R)$$

$$m(t) = M_o\mathrm{sech}((t-t_o)/\tau_R)$$

$$t_o = \frac{\tau_R}{2}\ln\left[\frac{1\{\mp\}\frac{m_z(0)}{M_o}}{1\{\pm\}\frac{m_z(0)}{M_o}}\right] = \tau_R\mathrm{sech}^{-1}\left[\frac{m(0)}{M_o}\right]$$

$$\omega_o = -\gamma B_z\{\pm\}\frac{\cos\alpha}{|\sin\alpha|}\frac{\tanh((t-t_o)/\tau_R)}{\tau_R}$$

Implications of the Superradiant State Equations of Motion:

Under appropriate conditions, the nuclear magnetism from one or more molecules in a sample or subject contained in one or more resonant coils can be made to feedback upon itself. Under such conditions we describe these molecule(s) as being in the "superradiant (SR) condition". The SR condition is defined as being where $\tau_R \leq T2$. Clinical MR machines cannot normally produce $\tau_R \leq T2$ conditions.

This disclosure teaches, in addition to other teachings, methods and systems for achieving the SR state even for low concentrations of molecules in otherwise clinical conditions. These teachings include: use of a feedback enabled coil (FEC) to amplify, phase shift and feedback into the one or more RF coils the current generated by one or more ensembles of nuclear spins in the target volume, the SSR, or both. that. In addition we teach the use of an additional volume, termed the Supplementary Spin Reservoir (SSR) which is inserted into the field of the MR device to ensure that one or more molecules in the MR device are in the SR condition.

Applicant has discovered that implications of the SR condition are:

1) in SR conditions the nuclear magnetization of even very low concentration nuclei can be returned to equilibrium very rapidly, much faster than "normal" $T_1$ (i.e., what time would be required for return to equilibrium in non SR conditions), with the time of return being governed by $\tau_R$ which in turn can be selected by adjusting the settings of the feedback enabled coil and/or the characteristics of the molecules in the SSR.

2) Nuclei with different precessional frequencies and/or different $T_2$s in the FOV of the FEC can be distinguished from one another because they will have different $\tau_R$ and $t_0$s. For example this allows the magnetic vector of one set of nuclei to be rotated to a preferred angle exclusive of other nuclei in the FOV.

3) Adjusting the phase and/or gain of the feedback enabled coil can also be used, either separately, together, or in conjunction with other processes, to suppress or highlight signal from selected resonances preferentially over others. This allows unwanted resonances to be suppressed, for example. It also allows identification of the presence and quantity target molecules.

Exemplary MRI Scanner Systemization

Figure 4A:
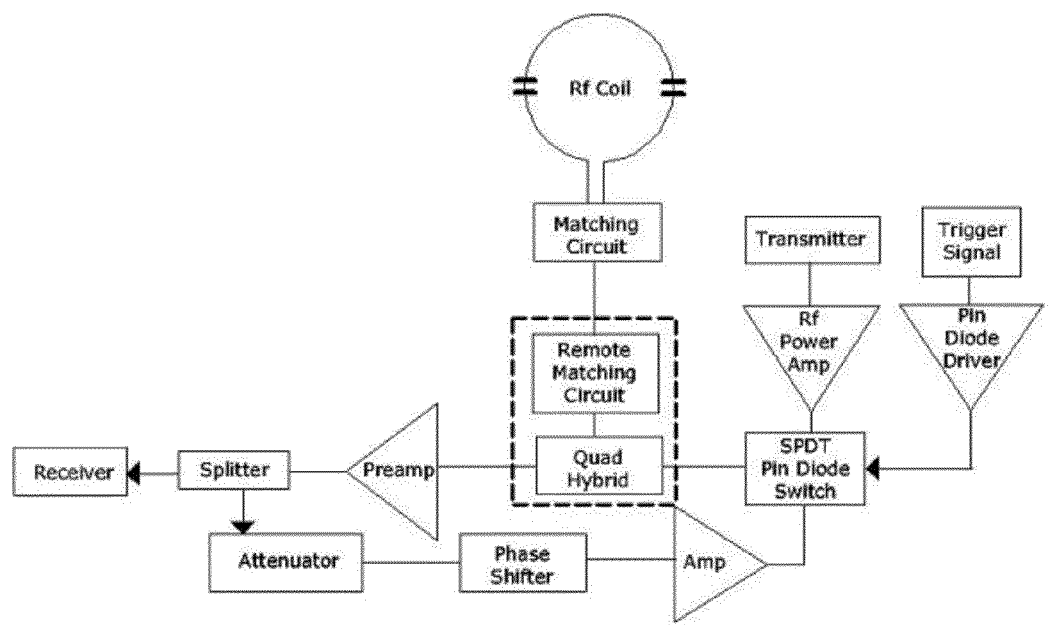
FIG. 4A depicts an example of circuitry of a feedback enabled coil ("FEC"), wherein the phase angle of the feedback field can be adjusted, either manually or via computer control, by adjusting a phase shifter. Gain of the field can be manipulated by changing the attenuator.
Figure 4B:
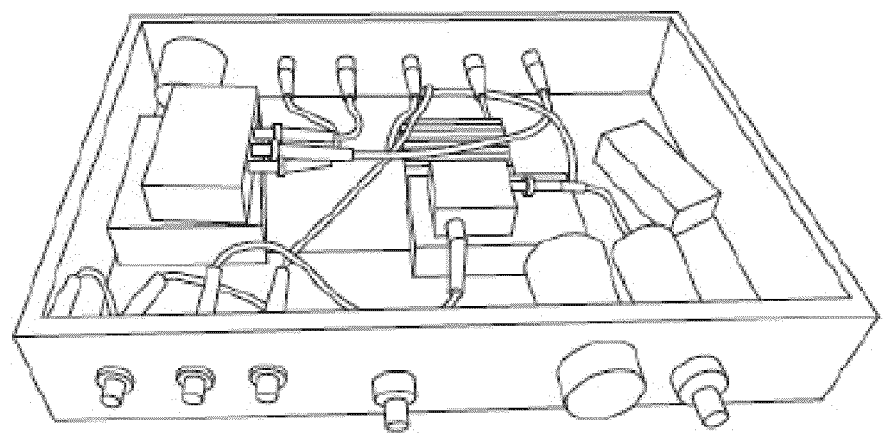
FIG. 4B depicts an example of a prototype FEC electronics box.

An exemplary magnetic resonance system is depicted in FIG. 4, and includes a plurality of primary magnetic coils 10 that generate a uniform, temporally constant magnetic field $B_0$ along a longitudinal or z-axis of a central bore 12 of the device. In a preferred superconducting embodiment, the primary magnet coils are supported by a former 14 and received in a toroidal helium vessel or can 16. The vessel is filled with helium to maintain the primary magnet coils at superconducting temperatures. The can is surrounded by a series of cold shields 18 which are supported in a vacuum Dewar 20. Of course, annular resistive magnets, C-magnets, and the like are also contemplated.

Figure 2:
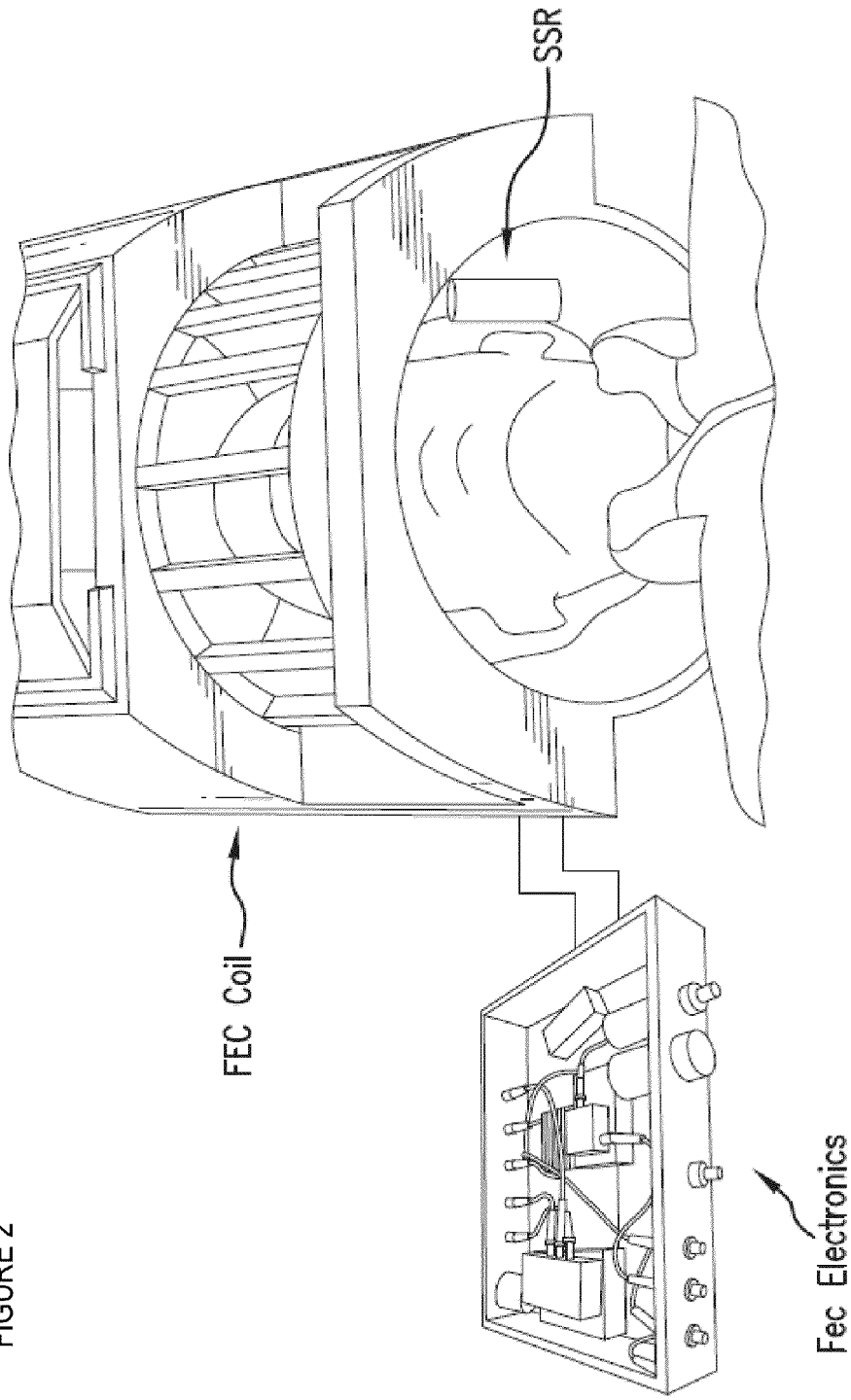
FIG. 2 depicts a subject inside a Feedback Enabled Coil (FEC) with an Supplementary Spin reservoir (SSR) located nearby and inside the Field of View (FOV) of the same FEC.

A whole body gradient coil assembly 30 includes x, y, and z-coils mounted along the bore 12 for generating gradient magnetic fields, Gx, Gy, and Gz. Preferably, the gradient coil assembly is a self-shielded gradient coil that includes primary x, y, and z-coil assemblies 32 potted in a dielectric former and secondary x, y, and z-coil assemblies 34 that are supported on a bore defining cylinder of the vacuum Dewar 20. A whole body radio frequency coil 36 can be mounted inside the gradient coil assembly 30. A whole body radio frequency shield 38, e.g., copper mesh, can be mounted between the whole body RF coil 36 and the gradient coil assembly 30. If desired, an insertable radio frequency coil 40 can be removably mounted in the bore in an examination region defined around an isocenter of the magnet 10. In the embodiment of FIG. 2, the insertable radio frequency coil is a head and neck coil for imaging one or both of patient's head and neck, but other extremity coils can be provided, such as back coils for imaging the spine, knee coils, shoulder coils, breast coils, wrist coils and the like.

With continuing reference to FIG. 4, an operator interface and control station is provided that includes a human-readable display, such as a video monitor 52, and operator input devices such as a keyboard 54, a mouse 56, a trackball, light pen, or the like. A computer control and reconstruction module 58 is also provided that includes hardware and software for enabling the operator to select among a plurality of pre-programmed magnetic resonance sequences that are stored in a sequence control memory, if rf pulses are to be used as a part of the imaging study. A sequence controller 60 controls gradient amplifiers 62 connected with the gradient coil assembly 30 for causing the generation of the Gx, Gy, and Gz gradient magnetic fields at appropriate times during the selected gradient sequence and a digital transmitter 64 which causes a selected one of the whole body and insertable radio frequency coils to generate $B_1$ radio frequency field pulses at times appropriate to the selected sequence, if rf pulses are to be used in the study.

MR signals received by the coil 40 are demodulated by a digital receiver 66 and stored in a data memory 68. The data from the data memory are reconstructed by a reconstruction or array processor 70 into a volumetric image representation that is stored in an image memory 72. If a phased array is used as the receiving coil assembly, the image can be reconstructed from the coil signals. A video processor 74 under operator control converts selected portions of the volumetric image representation into slice images, projection images, perspective views, or the like as is conventional in the art for display on the video monitor.

Improved MRSI:

The challenge to molecular imaging using MRSI is that in vivo concentration of target molecules is so small that detection is very difficult or impossible in clinically feasible conditions (which conditions include using MRI scanners with reasonable field strength and reasonable time periods for the clinical scan of the sample). As a consequence, physicians have increasingly turned to radioactive tagging using $F^{18}$ and other radio-isotopes, as source of signal for detecting target molecules using PET.

Fluorinated glucose, which is transported into cells via glycolisis, is a case in point. Cancer cells are known to have higher glycolitic rates than healthy tissue. Once in the cell, fluorinated glucose is metabolized via hexokinase to fluorinated glucose-6-phosphate and other metabolites. These molecules are transported out of the cell at rates much lower than in ordinary glucose metabolism. As a result, the fluorinated glucose-6-phosphate can be considered "trapped" in the cell for extended periods of time (longer than 1 hour). Hence the expectation is that cell masses showing higher than background concentrations of fluorinated glucose can be quantitatively evaluated for likelihood of being cancerous.

PET $F^{18}DG$ has emerged over the last 30 years as a reliable technique for identifying the presence of cancerous tissue, and more recently PET $F^{18}DG$ has been employed for other diagnostic purposes, including the evaluation and management of patients with suspected ischemic left ventricular systolic dysfunction, and the evaluation and management of patients with certain neurological indications (such as dementia and seizure). However, the approach has the considerable drawback of subjecting the patient to a radioactive burden, allowing it be used only intermittently and in circumstances where the benefits of the PET scan in light of an individual patient's health risks are determined (by the treating physician and the patient) to outweigh the radiation burden, such as after a positive identification for cancer has already been made. In addition, the costs and risks to staff and the environment when manufacturing, distributing and employing radioactive isotopes are high.

Because the strength of the signal emitted by the radioactive isotope in $F^{18}DG$, is large very small doses of $F^{18}DG$ are required for PET studies. By contrast $F^{19}DG$ is non-radioactive and biologically identical to $F^{18}DG$, but at clinically safe dose levels research has suggested its key metabolite, intracellular $F^{19}DG$-6-phosphate, is available is at a very low concentrations below the threshold of detection by disclosed MRSI methods and systems under clinically feasible conditions (reasonable MRI field strength and reasonable clinical scan times). As a result, while $F^{18}DG$ is currently useful as a diagnostic imaging agent using PET, $F^{19}DG$ has not been shown to be clinically useful as a diagnostic imaging agent using MRSI.

To date, translation of MRSI to clinical use has been hampered by the poor signal to noise ratio (SNR) of target molecules at low concentrations, as in the example above, and/or difficulty in obtaining spectral selectivity of target molecule(s). Though moderate increases to SNR are available through various engineering improvements (such as larger magnetic fields) none of these have the potential to enable detection of in vivo biomarkers such as those described above.

Applicant has devised a novel approach to address these limitations, based on controlled feedback-driven MR, termed "super-radiant" (SR) MR herein. The goal is to exploit SR to enable much more rapid imaging and/or increase the spectral selectivity of targeted molecules in order to meaningfully improve detection of molecules using MRSI techniques, in particular molecules that would otherwise be undetectable using standard MRSI techniques under clinically feasible conditions. Improved spectral selectivity will enable MRSI techniques to produce more sensitive and detailed in vivo maps of clinically relevant molecules such as glucose, choline, lactate, and others. The method disclosed below allows for the substitution of non-radioactive markers, such as protons, $F^{19}$ and other stable nuclei, for radioactive markers, such as $F^{18}$ or $N^{13}$, greatly improving the potential of MRSI for clinical use. This would in turn empower physicians to make diagnostic, therapeutic and surgical decisions based on the MRSI data, changing the clinical cost/benefit analysis available to patients and physicians since MRSI would not expose patients to harmful ionizing radiation associated with PET and/or Computed Tomography (CT). The benefits and potential applications of MRSI as a non-radioactive diagnostic technology are significant, and may in time include earlier screening for specific conditions, real time monitoring of therapeutic response and other clinical applications.

The present disclosure teaches methods and systems to exploit properties of the so-called "super-radiant" (SR) state, defined herein, so as to either: 1) increase the available signal to noise per unit time from one or more target nuclei and/or 2) improve distinguishability between molecules for a wide variety of MRSI studies. The present disclosure further teaches methods and systems for the production of the SR state for low concentrations of molecules in clinical MRSI conditions.

As demonstrated herein, the SR state is not one that occurs under normal clinical MRSI conditions. We therefore teach the inclusion in the MR machine of a coil whose electronic circuitry has been configured so as to amplify any feedback field henceforth referred to as the Feedback Enabled Coil (FEC) and of a volume, henceforth to be referred to as the Supplementary Spin Reservoir (SSR). The role of the SSR is to facilitate the production of SR conditions so that the properties of the SR state (described below) may be more fully exploited for the purposes of improving one or more MR studies, imaging protocols, spectroscopic analyses, etc. In a preferred embodiment, the SSR is a container with a predetermined concentration of one or more molecules that will be the target molecule(s) of the SR MRSI. The SSR is preferably situated ex vivo and placed proximate to the sample to be imaged (for example a human or an animal) and within the field of view (FOV) of one or more FECs. It may also be contained in its own dedicated coil/FEC arrangement.

Applicant has discovered that:

1) In SR conditions the nuclear magnetization of even very low concentration nuclei can be returned to equilibrium very rapidly, much faster than "normal" $T_1$ (i.e., the time required for return to equilibrium in non-SR conditions), with the time of return being governed by $\tau_R$ (defined below) which in turn can be selected; for example by adjusting the settings of the FEC and/or the characteristics of the molecules in the SSR.

2) Nuclei with different chemical shifts and/or different $T_2$s in the viewing volume of the imaging coil can be distinguished from one another because they will have different $\tau_R$ and $t_0$s (defined above).

3) By adjusting the phase of the FEC, a frequency shift can be induced in one or more target nuclear magnetizations. This can also be used, either separately or in conjunction with other processes, to distinguish between molecules with different $\gamma$ and/or different $T_2$s in the viewing volume of the imaging coil.

The present application also relates to methods for detecting and/or imaging biomarkers in vivo in a subject [for example a patient or an animal] that employs the SR technology and SSR described herein. The methods can include:

i) administering a composition including an imaging amount of at least one biomarker or precursor biomarker molecule to a subject to be imaged;

ii) positioning the subject in an MRSI device with a FEC and a detection coil to allow the detection of the biomarker in vivo;

iii) including an SSR containing a predetermined amount of the biomarker molecule within the FEC wherein the predetermined amount of the biomarker molecule in the SSR is an amount necessary to induce a SR state for the biomarker; and iv) detecting the biomarker in the subject using MSRI and obtaining an image of the desired region of the sample.

v) combining data obtained as described above with anatomical and other MRI data, obtained from the subject in the same session, as may be useful and known in the art, to form a composite database and images derived from it The biomarker employed in the methods of the present disclosure may be any clinically relevant molecule that will be tolerated by the subject and accumulate in areas, i.e., systems, organs, tissues, or tumors, of the subject which are of interest for imaging and/or diagnostic purposes. In one preferred embodiment, the biomarker is a molecule that contains at least one or more fluorine atoms. Fluorine is a preferred embodiment as it is isotopically 100% 19F which has a relatively large gyromagnetic ratio and low background signal in vivo.

One or more biomarkers may be administered to the sample in the above method to enhance the imaging capability. It is also envisioned that a precursor biomarker may be administered to the subject. As used herein, the precursor biomarker is typically a molecule that is metabolized by the subject after administration which then produces a metabolite molecule or molecules that may be selected as a target biomarker for imaging. In such an instance, the SSR can contain the selected metabolite and may or may not contain the precursor. It is also possible that the administered biomarker can serve as a target biomarker for imaging and as a precursor biomarker so that metabolites of the administered biomarker can be targeted for imaging.

The SSR is configured to contain an amount of the biomarker suitable for inducing SR conditions for the biomarker within the FEC. The SSR may contain one or more biomarkers wherein each of the biomarkers in the SSR device are present in an amount that will induce SR conditions for the particular biomarkers within the FEC included in an MRSI device.

Under appropriate conditions, the nuclear magnetism from one or more molecules in a sample contained in one or more FEC coils can be made to feedback upon itself. Under such conditions we describe these molecule(s) as being in the super-radiant "state" (SR). The SR state is defined as being where $\tau_R \leq T2$. Clinical MR machines cannot normally produce the conditions necessary to produce $\tau_R \leq T2$. The present disclosure teaches, in addition to other teachings, methods and systems for achieving the SR state even for low concentrations of molecules in otherwise clinical conditions. These teachings include: use of a feedback enabled coil so that the active Q of one or more FEC coils included in, or added to, an MR machine can be made very high, and the use of an SSR, preferably ex vivo, to ensure that one or more molecules in the MR machine are in the SR state.

An embodiment of the present disclosure employs the use of characteristics of the SR state described above, preferably in conjunction with an ex vivo SSR, to greatly enhance the achievable signal to noise ratio (SNR) in an MRSI image or spectroscopic analysis of a biomarker or molecule with intrinsically low concentration. Applicant has found that the potential gain in SNR should be sufficient to allow many biomarkers to be detected in vivo—in particular, but not exclusively, biomarkers containing one or more $F^{19}$ atoms—under clinical conditions.

It has been previously demonstrated that, by creating SR conditions, the nuclear magnetism of the sample can be rotated very quickly back to its equilibrium position. For example, in the SR state it has been shown in the prior art that 99.96% of equilibrium 1H magnetization in water can be returned to equilibrium in 10 milliseconds, far faster than the "natural" T1 of the water which was measured to be 865 milliseconds.

Being able to increase the number of scans per unit time has a direct impact on the intensity that can be obtained in an MRSI scan. For example, signal averaging is a well-known technique for increasing image intensity wherein successive scans are added together; the overall impact is to improve SNR as the square root of N where N is the number of scans. Since clinical MRSI sessions are generally limited to no more than an hour or so per sample, increasing the number of scans per unit time can directly improve image intensity.

Feedback in NMR systems with high field, high Q and high density of nuclei is well known. However, production of feedback for detection and/or imaging of biomarkers, with typical concentrations in the micromolar range, under clinical MRSI conditions is more challenging. In vivo biomarker concentrations are generally much too low to produce SR conditions in a 3 T or even 7 T clinical MRSI device. Even with a circuit to amplify the feedback field, the amplifier gain would have to be prohibitively high to produce feedback in biomarkers with concentrations on the micromolar scale. Even if very high gains could be employed the very low SNR of the target nuclei in such cases would make it very difficult to produce a useful signal to feedback; noise would overwhelm the signal. Also, during in vivo MRSI scans, the nucleus of interest is often some spin other than 1H. 1H has the highest gyromagnetic ratio of all nuclei and hence produces feedback most easily; attempting to cause feedback with ensembles of $F^{19}$ and $C^{13}$ spins is more difficult.

Embodiments of the present disclosure employ the previously described FEC and SSR to allow the magnetization of low concentration molecules, i.e., biomarkers, to feedback more easily by including in the FEC of the MRSI device, preferably ex vivo to the sample, a predetermined amount of one or more molecules that contribute to creating SR conditions for that target or biomarker molecule (FIG. 2). In a preferred embodiment, the molecule(s) in the SSR are identical to the in vivo target or biomarker(s) molecule. In a further preferred embodiment, the concentration of the molecule(s) in the SSR is made large enough to cause SR conditions for a given field and coil arrangement in the MRSI device. In a further preferred embodiment, one or more coils in the MRSI device are feedback enabled to further enhance control over creation of SR conditions.

Other embodiments include using a SSR containing one or more molecules containing nuclei whose resonances are similar, if not identical, to those of the in vivo target or biomarker molecule(s).

The inclusion of the ex vivo SSR and the FEC allow the nuclear magnetization of one or more target or biomarker molecules to be rapidly refreshed. Hence the number of images that can be taken per unit time is increased, leading to higher signal averaging per unit time and higher intensity of the resulting image.

The SSR may comprise a storage device or container for the target or biomarker molecule(s), the predetermined amount of the target or biomarker molecule(s) required to generate the SR conditions and optionally a carrier for the target or biomarker molecule(s). The SSR storage device or container should be made of any suitable material that will not interfere with the operation of the MRSI device such as glass or plastic and may be rigid or flexible. In embodiments of the present disclosure, the storage device is an ampoule. The ampoule can be of any size, shape and volume that can be easily accommodated within the MRSI device. In some embodiments the ampoules should have a volume of about 1 ml to 3000 ml and preferably about 1 to about 1000 ml. In certain embodiments, the SSR storage device or container is sealed to prevent contamination of the contents and to prevent the target or biomarker material from leaving the container. The carrier, if employed, in the SSR storage device or container may be water or another suitable liquid such as an alcohol or organic solvent. The carrier may also be an inert filler such as lactose or microcrystalline cellulose. In an alternative embodiment of the present disclosure, the SSR includes a tablet or capsule containing the predetermined amount of the target or biomarker molecule(s) required to generate the SR conditions.

In certain embodiments, the SSR will be labeled with a bar or QR code that can be scanned and the data sent to the MRSI device to allow the MRSI device and operator to know which target or biomarker molecule(s) will be the subject of the SR conditions. The bar or QR code could additionally facilitate the invoicing of patients. The labels will also contain words and/or visual symbols that will allow the operator of the MRSI device to select the appropriate SSR for inclusion with the particular patient scan.

Because of the variability of the in vivo levels of the target or biomarker molecule(s) in a particular patient, the SSR will be prepared with at least the minimum amount of the target or biomarker molecule(s) that will be required to generate the SR conditions within one or more FECs. Such amount will be the amount required to generate the SR conditions even in the absence of any contribution from the target or biomarker molecule(s) from the patient. Stated another way, the SSR will contain the amount of target or biomarker molecule(s) that generate the SR conditions within the FEC of the MRSI device when a patient is not present in the coil or MRSI device. In embodiments of the present disclosure, the minimum amount of target or biomarker molecule(s) necessary to generate the SR conditions can be determined by application of the following equation: $\tau_R \leq T2$ where $\tau_R$ is defined in the previous section The necessary or minimum amount of target or biomarker molecule(s) may be in one or more SSR devices present in the coil or device. Similarly, if more than one target or biomarker molecule is the focus of the MRSI scan, each individual target or biomarker molecule may be present in a separate and distinct SSR device or the combination of the individual target or biomarker molecules may present in one or more SSR devices.

Embodiments of the present disclosure may also use SR to more effectively distinguish between molecules in MRSI studies.

From the equations above, several methods for enhancing distinction between resonances from different molecules can be drawn. For example, Equation 18 above shows that, the time required for the magnetization of a particular molecule to flip back to 90 degrees (i.e., where t=t0) depends on $\tau_R$, which in turn depends on the amount of that molecule in the sample. $\tau_R$ for a target molecule can be adjusted externally; in particular, it can be made to be very different from that of any other molecule in the FOV. In one embodiment, this can be done by including in the FEC a SSR containing a large amount of the target molecule. In another embodiment, this can be done by adjusting the gain and/r phase shift of the feedback enabled coil or coils. In a preferred embodiment, both inclusion of an ex vivo SSR containing the target molecule and adjustment of the FEC are used to produce the desired SR characteristics in the target molecule.

For example, the magnetization of a target molecule can be rotated to 90 degrees (with respect to the main magnetic field) while those of others maintained at 180 degrees or at some other angle, as seen in FIG. 3. This can facilitate distinguishing between the magnetization of one ensemble of nuclei and another.

Embodiments of the present disclosure include methods (and associated systems and machine readable programs for implementing the methods) for producing SR under standard clinical MRSI conditions. For example, Applicant has discovered that production of feedback conditions can be created in vivo by introducing an ex vivo SSR, filled with one or more target biomarker molecules, outside the patient but still inside the FEC (FIG. 2). The presence of a large number of identical molecules makes it possible to create SR specifically tuned to that molecule and/or a particular nuclei in that molecule. The feedback field created by the large number of spins in the SSR affects the identical target molecules that are inside the sample equally. Thus, the nuclei of interest in the target or biomarker molecule(s) within the sample can gain the benefit of a highly accelerated return to equilibrium even though their concentration in vivo is extremely low. This allows for in vivo images/spectra to be acquired much more rapidly, increasing the SNR per unit time and the image intensity. Applicant has discovered that intensity gains obtained in this manner are sufficient to allow many different molecules with intrinsically low concentrations in vivo to be imaged.

Applicant has further discovered that, by optionally coupling any of the above methods with a coil whose electronic circuitry has been configured so as to amplify and/or phase adjust any feedback field, conditions for producing SR under a wide variety of ambient conditions can be enhanced. FIG. 4 shows one embodiment of such a coil's circuitry. Further details on such a coil can be found in U.S. Provisional Patent Application Ser. No. 61/733,415, filed Dec. 4, 2012, which is incorporated by reference herein in its entirety. Other preferred embodiments can include employing RF pulse sequences to create SR conditions for one or more target nuclei of interest.

Further RF Coil Implementations

SR conditions have been heretofore largely unknown in clinical MR because the requisite conditions—high magnetic field and/or high probe quality factor Q—are not produced by commercially available MR machines known in the art. SR conditions are a more common phenomenon in high field NMR studies, where they are generally considered an annoyance as their best known effect is to broaden the spectroscopic lines of the nuclei under observation. SR conditions are not desirable when one is trying to resolve the identity of many different molecules in a single sample, which is the goal typical of many NMR studies. The present disclosure recognizes that SR conditions can be a benefit when the goal is the identification and quantification of a single molecule to the exclusion of others in the field of view. By adding the notion of control, through the use of a Feedback Enabled Coil (FEC) and a Supplementary Spin reservoir (SSR), SR enables powerful feedback-driven MR methods.

As discussed elsewhere herein, SR occurs when $\tau_R \leq T2$ conditions are arranged for one or more set of nuclei, where $\tau_R = 1/\gamma\beta|\sin\alpha|M_o$. In this expression, $\beta$ and $\alpha$ are the magnitude and phase of the gain factor generated by a feedback enabled coil, $\gamma$ is the gyromagnetic ratio, and $M_o$ is the maximum value of the magnetization, which will be equal to thermal polarization.

As noted above, MR scanners known heretofore in the art are not generally capable of producing the conditions required for SR. In addition, they are not typically set up as feedback-enabled devices. One way to overcome these factors is to build a coil capable of producing feedback even under clinical MR conditions. The coil/electronics are preferably able to adjust the phase of the magnetization as well as the gain of the feedback. We term such a coil a Feedback Enabled Coil (FEC). Schematics of exemplary hardware are presented below.

Figure 8:
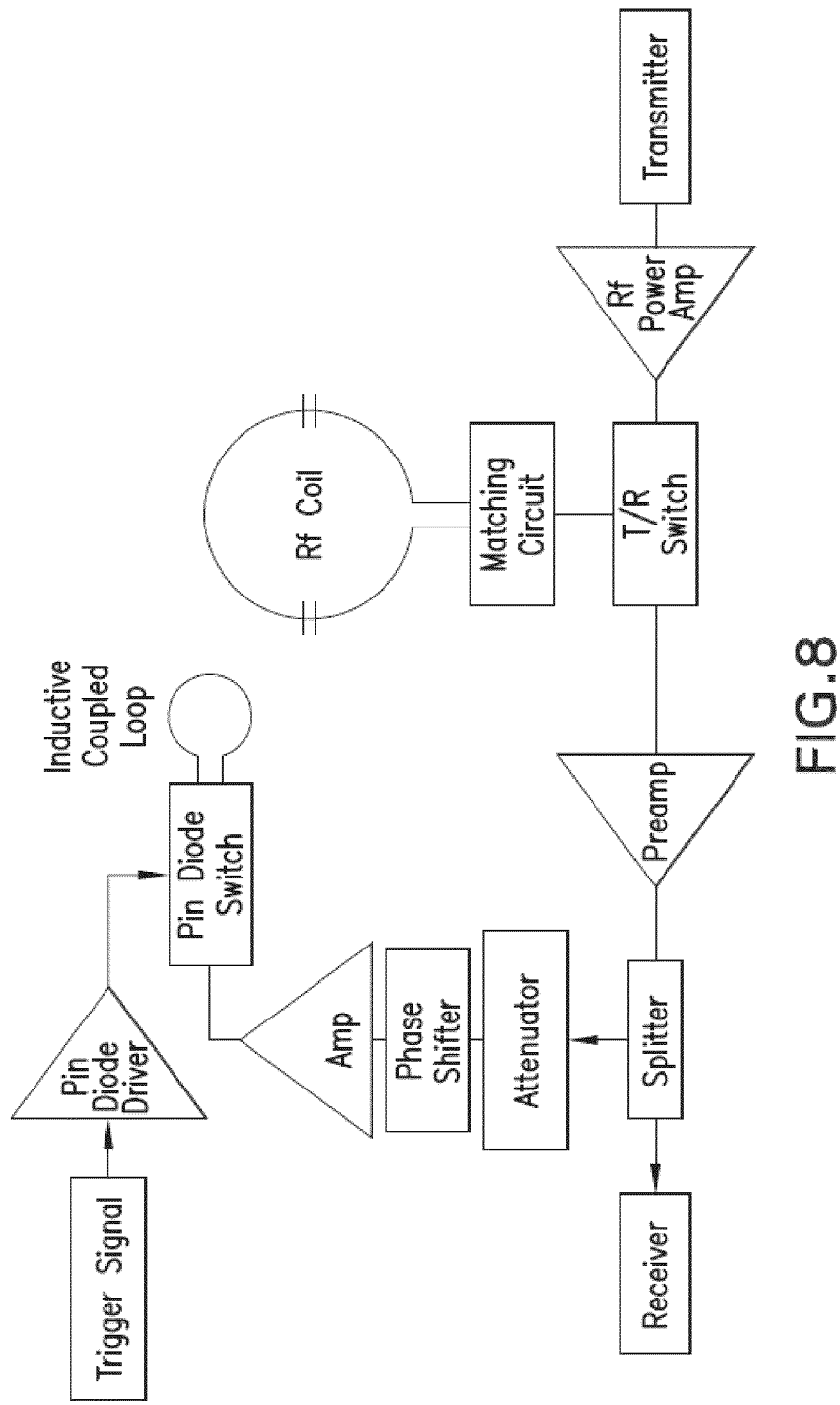
FIG. 8 is an example of a feedback system known in the art.

An example of a feedback system known in the art is shown in FIG. 8. In this particular case, a transmit/receive surface coil is employed in a typical manner. In principle, any RF coil can be used, even receive-only coils, thus we will refer to this coil as the RF coil. The output of the preamp is split off and fed into a feedback circuit. After applying the appropriate attenuation and phase setting/shifting, the output of the feedback circuit is then fed back into the RF coil via an inductively coupled loop. In principle, the gain and phase may be any value with the potential to shorten the radiation damping constant to any desired value. Also, as a pin diode switch is employed, radiation damping can be turned on and off under system control via a pulse sequence.

However, the circuit of FIG. 8 has two major shortcomings for a practical implementation of radiation damping. The inductively coupled loop is loosely coupled to the RF coil. This is necessary to prevent the output of the feedback circuit to adversely affect the tune and match of the RF coil. Consequently, greater power is required by the feedback circuit than is necessary. To achieve small radiation damping constants, an improvement in efficiency is necessary to reduce power requirements. A second shortcoming is that the signal coming from the RF coil has two significant components. One component is the RF signal arising from the magnetization of the spin system. The second component is the signal generated by the feedback circuit. Fortunately these two components are normally phase shifted by 90°, so that it is possible to maintain a stable mode of operation for the feedback circuit. While the inefficiency of the circuit helps to promote stability, the circuit will be sensitive to phase. With sufficient gain, there is the danger of creating positive feedback.

Figure 9:
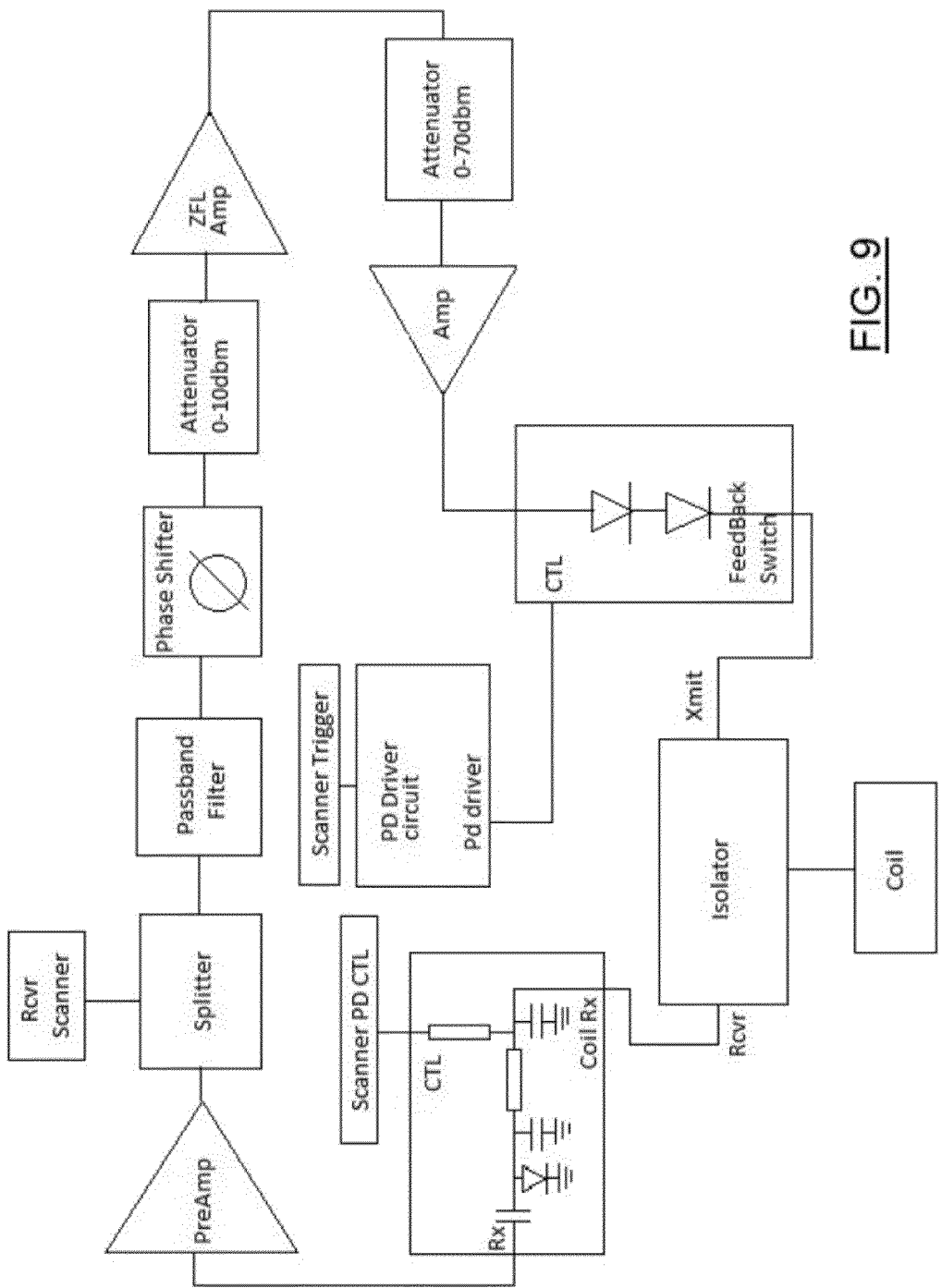
FIG. 9 is an example of a feedback system for a FEC coil provided in accordance with the disclosure.

Applicant has developed a circuit design which overcomes these shortcomings as shown in FIG. 9. A component of the embodiment of FIG. 9 is the isolator block, which causes reflected power from the RF coil to appear on the output of this circuit but not upon the input. This block can have different designs depending upon the type of RF coil employed. The reflected power from the NMR coil will again have two components, one component from the spin system and the other component will be reflected power from mismatch with the coil. Additional remote tuning/matching circuit(s) inside the isolator block can minimize the reflected power due to any impedance mismatches while the NMR signal which arises from the spin system is coupled efficiently to the receiver and feedback circuit. This can minimize the undesirable component while maintaining an efficient coupling to the coil. If the embodiment of the RF coil is a receive-only coil, then the circuit is further simplified by removing the transmitter and RF power amp from the figure. The design of the isolator block can vary depending upon the type of coil used. If a surface coil (or any coil that is considered linear) is used, then the isolator block might utilize a quadrature hybrid along with a divider, i.e. Wilkinson divider and a remote matching circuit. If a quadrature or circularly polarized coil is used then the isolator block may include two remote matching circuits and one quadrature hybrid. Other designs are possible for the isolator block whose primary purpose is to separate the signal into forward power (coil transmission) and reflected power (coil reception). This design is scalable to parallel imaging coil arrays.

Electronic noise is amplified and fed back by the circuit in a similar manner to the signal. If the noise is large enough it can overwhelm the desired SR effect and cause the spins to oscillate randomly or not at all.

To limit the effect of noise, in a preferred embodiment, the circuit can contain one or more RF filters; for example, bandpass filters whose passband is centered on the Larmor frequency of the target nuclei. Previous RF feedback coil designs have not incorporated this feature to the knowledge of Applicant. The overall filter bandwidth is preferably small enough to ensure that all, or most, frequency components within the bandpass of the filter do not generate positive feedback.

Applicant has further discovered that different electronic components have different group delays; that is, exhibit different relationships between phase shift and frequency. It is desirable to use components whose collective group delays are as short as practicable so that one or more phase shifters can be used to effectively feedback one or more target magnetizations. This is particularly true of filters whose group delays can vary over a large range.

EXAMPLE

Figure 10B:
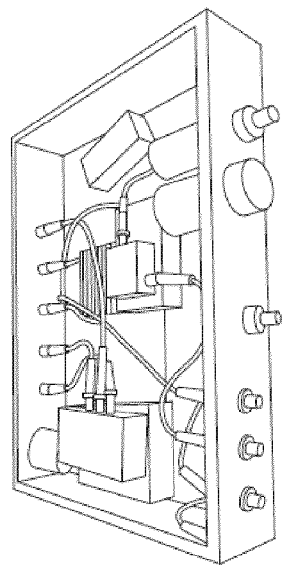
FIGS. 10 A-C are depictions of a FEC coil and supporting hardware provided in accordance with the disclosure.
Figure 10C:
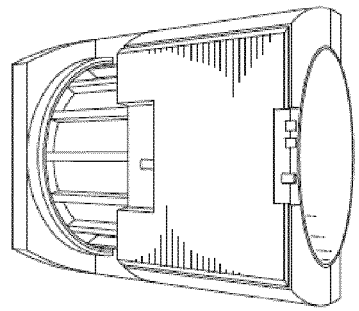
Figure 10A:
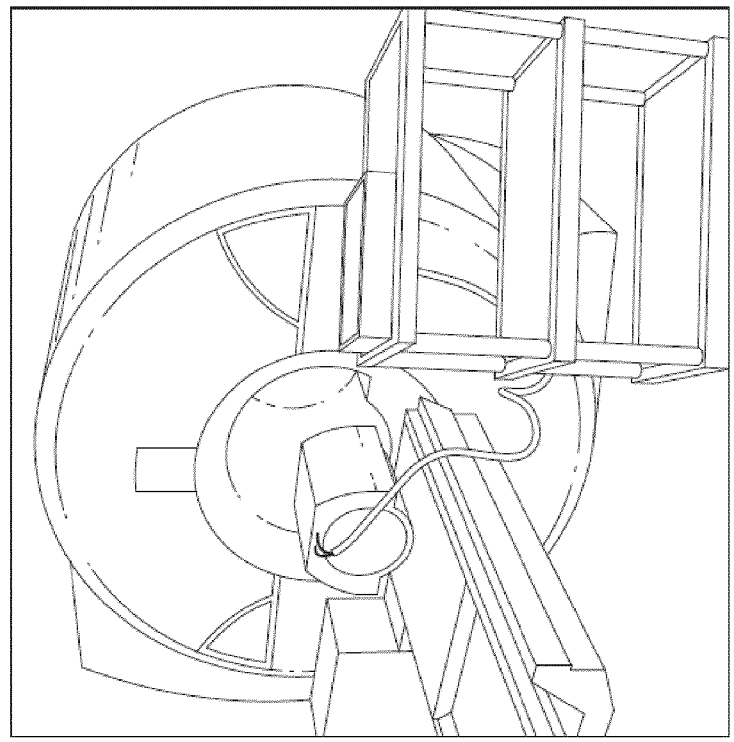

In one example, a commercially available head coil (e.g., FIG. 10C) (e.g., single channel) for operation on a 1.5T Siemens Avanto MRI scanner (FIG. 10A) can be used, and modified to be operated using a feedback circuit with a isolator block as set forth above with respect to FIG. 9, such as the illustrative embodiment depicted in FIG. 10B. A low power amplifier can be used initially (~10 watts) to test the feedback circuit, to insure against positive feedback, and to obtain initial results.

Figure 11:
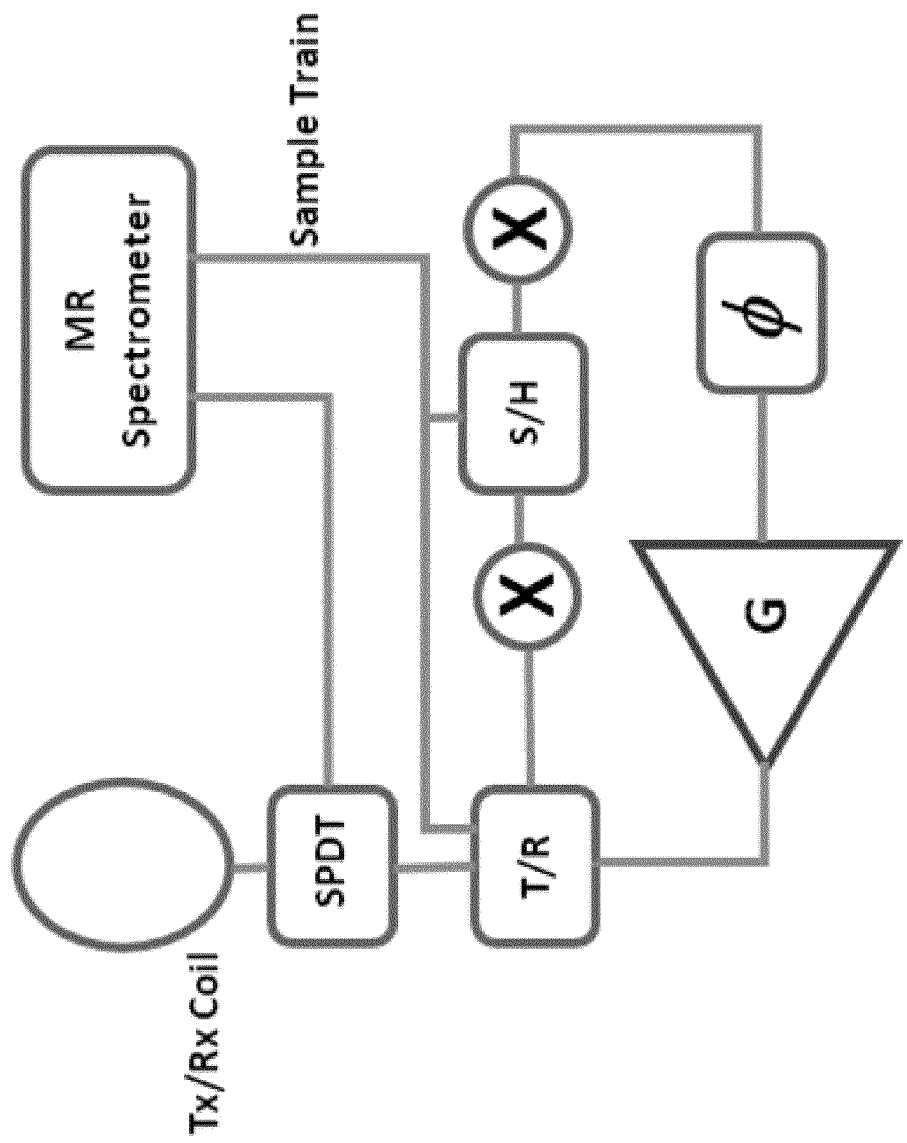
FIG. 11 depicts a further example of a feedback system for a FEC coil provided in accordance with the disclosure.

Yet a further embodiment of an illustrative circuit is provided in FIG. 11. The illustrated circuit provides time interleaved feedback by separating the radiation damping ("RD") transmit and receive in time. This approach has the benefit of avoiding positive feedback and thus allows larger gains to be applied. This in turn can allow for shorter RD time constants. A description of the circuit follows. The SPDT switch is used to change between the normal MR scanner operation and RD feedback mode. When operated in RD mode, the feedback time separation is achieved through the sample and hold (S/H) and the switching of the transmit-receive switch (T/R) via a pulse or sample train which is provided by the MR spectrometer. Typically the pulse train is on the order of 10-100 KHz. The two mixing stages (indicated by X) are quadrature modulators to convert the feedback signal to DC for the sample and hold and then to convert the sample and hold output back to the Larmor frequency of the spins. The phase shifter provides the appropriate phase so that the RD field will drive the spins back to equilibrium. The overall gain (G) of the loop is adjusted to reduce the effective RD time constant.

Many RF pulse sequences have been developed to drive equilibrium return time below T1 so that images can be acquired more rapidly. For example, Driven Equilibrium Fourier Transform (DEFT) applies a restoring RF pulse after an imaging scan to drive remaining transverse magnetization to equilibrium. This works well in some situations but for many in vivo molecules, where T1>>>T2, DEFT does not work well. Other RF pulse programs have similar drawbacks.

An example of a biomarker of interest for MRSI imaging is choline. Choline is a biomarker used in diagnosis of many cancers, in particular brain cancer. Specifically, an elevated level of choline in a suspect volume of tissue can be compared to background choline levels in non-cancerous tissue to diagnose the presence of cancer.

Choline is normally detected in an MRSI experiment by analysis of the proton spectrum taken from the suspect volume of tissue. The proton spectrum is intrinsically not very wide, being only ~15 ppm. In addition, the proton resonances of choline lie very close to that of other molecules normally found in the same volume of tissue such as glucose, NAA and others. Thus an issue is distinguishing the resonances belonging to the choline molecule from all the others also in the MR field of view.

Applicant has found that, by including in one or more FECs a SSR filled with one or more molecules, the nuclear magnetization from one or more target molecules in the FOV may be made to feedback upon itself. Applicant has further found that, in addition to the inclusion of such a SSR, the feedback parameters such as gain and/or phase of the nuclear magnetization of those target molecule or molecules can be adjusted by amending one or more FECs in the manner shown in FIG. 4.

As per equations 15 and 18 above, this method can then be used to shift either the angle of the nuclear magnetization from a target molecule or molecules with respect to others in the FOV, and/or shift their resonant frequency with respect to other molecules in the FOV.

Other examples of a target or biomarker of interest with the embodiments of the present invention are: (i) creatine (Cr), (ii) creatinine (Cm), (iii) Phosphorylcreatine (PCr), (iv) Creatine kinase (CK), (v) mitochondrial CK isoenzyme (Mi-CK), (vi) Cytosolic brain-type CK isoenzyme (B-CK), (vii) Cytosolic muscle-type CK isoenzyme (M-CK), (viii) L-Arginine: glycine amidinotransferase (AGAT), (ix) S -adenosyl-L-methionine:N-guanidinoacetate methyltransferase (GAMT), (x) guanidinopropionate (GPA), (xi) guanidinobutyrate (GBA), (xii) cyclocreatine 5 1-carboxymethyl-2-iminoimidazolidine (cCr), (xiii) homocyclocreatine 5 1-carboxyethyl-2-iminoimidazolidine (hcCr), (xiv) Glycocyamine 5 guanidinoacetate (Gc), (xv) taurocyamine (Tc), (xvi) lombricine (L), (xvii) a N-phosphorylated forms of a guanidino compound (PCrn, PGPA, PcCr, PhcCr, PArg, PGc, PTc, PL), (xviii) arginine kinase (ArgK), (xix) 2,4-Dinitrofluorobenzene (DNFB), (xx) S-adenosyl-L-methionine (AdoMet), (xxi) reduced glutathione (GSH), (xxii) oxidized glutathione (GSSG), and (xxiii) L-Ornithine:2-oxoacid aminotransferase (OAT) or (i) citrate, (ii) acetyl conenzyme A (acetyl CoA), (iii) oxaloacetate, (iv) aconitase, (v) pyruvate, (vi) NADH, (vii) FADH2, (viii) lactate and (ix) N-acetyl aspartate Another example of a target or biomarker of interest with the embodiments of the present disclosure are fluorinated glucose such as 2-fluoro-2-deoxy-D-glucose, 3-fluoro-3-deoxy-D-glucose or 4-fluoro-4-deoxy-D-glucose and preferable 2-fluoro-deoxy-D-glucose. The fluorine atom in these molecules is $F^{19}$. 2-fluoro-d-deoxy-D glucose is also known as FDG, $F^{19}DG$ or fludeoxyglucose. A radioactive form of FDG, i.e., $F^{18}DG$ is commercially available for intravenous administration as a radiopharmaceutical for diagnostic purposes in conjunction with PET.

FDG is useful as a diagnostic agent for various systems, especially cancer growths because cancer cells consume glucose at a higher rate than normal healthy cells. The similarity in size between the fluorine atom and hydroxyl moiety allow FDG to compete with glucose for transport from the patient's blood to target tissues or cells. Therefore, because the cancer cells consume more glucose than normal healthy cells, the cancer cells will consume more FDG than healthy cells and subsequently have a higher concentration of FDG than healthy cells, thereby allowing MRSI imaging in accordance with the present disclosure. FDG also is a useful diagnostic agent because it is metabolized, i.e., undergoes phosphorylation to the monophosphate, sometimes referred to as FDG-6-P or 2-fluoro-2-deoxy-D-glucose-6-phosphate. Unlike glucose that has undergone phosphorylation, FDG-6-P cannot be employed in further glycolytic pathways and has a membrane permeability that precludes diffusion from the cells back into the blood stream. Therefore FDG-6-P gets trapped intracellularly and becomes a biomarker formed by metabolism in the subject.

In embodiments of the present disclosure, FDG may be used for the characterization of pulmonary nodules, detection of primary cancer by cervical adenopathy, liver or bone metastases and/or characterization of pancreatic mass. In embodiments of the present disclosure, FDG may be used to stage head and neck cancers including assistance in guiding biopsy, primary lung cancer, locally advanced breast cancer, oesophogeal cancer, carcinoma of the pancreas, colorectal cancer particularly in restaging occurrences, malignant lymphoma and/or malignant melanoma. In embodiments of the present disclosure, FDG may be used to monitor the therapeutic response of head and neck cancer and/or malignant lymphoma. In embodiments of the present disclosure, FDG may be used to detect recurrences of glioma with high grade malignancy (III or IV), head and neck cancers, thyroid cancer (non-medullary), primary lung cancer, colorectal cancer, ovarian cancer, malignant lymphoma and/or malignant melanoma. The FDG of the present disclosure and procedures employing the same (and associated systems and machine readable programs) may also be used in a diagnostic test of viable myocardial tissues with affinity for glucose. Additional applications for FDG include the diagnosis or evaluation of certain neurological conditions such as dementia or seizure where tissue with hypometabolism of glucose is an indicator of pathology.

Embodiments of the present disclosure include methods (and associated systems and machine readable programs) for detecting and/or imaging fluorinated glucose and/or metabolites of fluorinated glucose in vivo in a sample that employ the SR and SSR technology described herein. These embodiments comprise the steps of:

i) administering a composition comprising an imaging amount of a fluorinated glucose, preferably FDG, to a subject;

ii) positioning the subject in an MRSI device with a FEC and a detection coil to allow in vivo detection of the fluorinated glucose, metabolites of the fluorinated glucose, such as FDG-6-P, or combinations of the fluorinated glucose and metabolites of the fluorinated glucose;

iii) positioning an SSR containing a predetermined amount of the fluorinated glucose, metabolites of the fluorinated glucose or combinations of the fluorinated glucose and metabolites of the fluorinated glucose within the FEC region wherein the predetermined amount of the fluorinated glucose, metabolites of the fluorinated glucose or combinations of the fluorinated glucose and metabolites of the fluorinated glucose in the SSR is an amount necessary to induce a SR state for the fluorinated glucose, metabolites of the fluorinated glucose or combinations of the fluorinated glucose and metabolites of the fluorinated glucose; and iv) detecting the fluorinated glucose, metabolites of the fluorinated glucose or combinations of the fluorinated glucose and metabolites of the fluorinated glucose in the subject using the MRSI and obtaining an image of the desired region of the subject embodiments of the present disclosure v) combining data obtained as described above with anatomical and other MRI data, obtained from the subject in the same session, as may be useful and known in the art, to form a composite database and images derived from it The composition including the fluorinated glucose that is administered to the subject in the above described method may be a solid or liquid. If a solid, it may be in the form a powder, sachet, tablet or capsule. The solid composition will include the fluorinated glucose, preferably FDG, in an amount of 50 to 1000 mg and conventional pharmaceutical excipients. The pharmaceutically acceptable excipients useful in the present disclosure can be selected from the group consisting of fillers, binders, lubricants, glidants, antiadherents, flavoring agents, coloring agents, disintegrants and mixtures of thereof. A more detailed description of the acceptable pharmaceutical excipients that may be employed in the present disclosure can be found in Rowe et al., *Handbook of Pharmaceutically Acceptable Excipients* (4$^{th}$ ed. 2003) or the United States Pharmacopeia 29, both of which are incorporated herein by reference. In certain embodiments of the present disclosure wherein a fluorinated glucose is the target biomarker, the conventional pharmaceutical excipients employed in the composition administered to the subject should exclude or limit sugar type compounds such as lactose, sucrose, maltose and fructose because these compounds will compete with the subjects absorption of the fluorinated glucose Examples of acceptable fillers, sometimes referred to as diluents, include water; sugars, such as lactose, sucrose, maltose, or microcrystalline cellulose; clays and mixtures thereof. Preferably, the filler should be a non-sugar compound.

Binders that are useful in the present disclosure include pharmaceutically acceptable substances with cohesive properties. Some examples include celluloses such as hydroxypropyl methylcellulose, hydroxypropyl cellulose and carboxymethycellulose sodium; polyvinylpyrrolidone; sugars; starches and mixtures thereof. Preferably, the binder should be a non-sugar compound Examples of lubricants, glidants and/or antiadherents that may be used in the embodiments of the present disclosure include talc, magnesium stearate, calcium stearate, stearic acid, hydrogenated vegetable oils, polyethylene glycols, silicon dioxide and mixtures thereof.

Flavoring agents that can be used in the embodiments of the present disclosure include peppermint, spearmint, wintergreen, cinnamon, coconut, coffee, chocolate, vanilla, menthol, licorice, anise, apricot, caramel, pineapple, strawberry, raspberry, grape, cherry, mixed berry, tropical fruits, mint and mixtures thereof.

Coloring agents that may be employed in embodiments of the present disclosure include FD&C-type dyes and lakes, fruit and vegetable extracts, titanium dioxide and mixtures thereof.

Examples of disintegrating agents that can be used in embodiments of the present disclosure include corn starch, croscarmelose sodium, crospovidone (polyplasdone XL-10), sodium starch glycolate (EXPLOTAB or PRIMOJEL) or any combination of the foregoing.

The solid composition should be designed to dissolve rapidly in the oral cavity, be chewed or release all of the fluorinated glucose into the stomach or gastrointestinal tract within 5 to 30 minutes upon ingestion. In an embodiment of the present disclosure, the solid composition is a 25 to 2000 mg oral tablet, preferably a 50 to 1500 mg oral tablet and most preferably a 100 to 1000 mg oral tablet.

The liquid compositions may be in the form of a solution or suspension that is capable of being orally administered, i.e., drunk, by the patient. These liquid compositions comprise the fluorinated glucose and a liquid carrier such as water, alcohol or a mixture of water and alcohol. The liquid oral compositions may further comprise conventional pharmaceutical excipients such as preservatives, antimicrobial agents, buffers, pH adjusting agents, flavoring agents, dyes or combinations thereof. A more detailed description of the acceptable pharmaceutical excipients that may be employed in the liquid compositions of the present disclosure can be found in Rowe et al., *Handbook of Pharmaceutically Acceptable Excipients* (4$^{th}$ ed. 2003) or the United States Pharmacopeia 29, both of which are incorporated herein by reference.

The liquid compositions may also be compositions that can be administered parentally, i.e., intravenously or intramuscularly. The liquid compositions for parenteral administration will comprise the fluorinated glucose and a liquid carrier, preferably water for injection. The parenteral liquid compositions may further comprise conventional pharmaceutical excipients such as preservatives, antimicrobial agents, buffers, pH adjusting agents, tonicity agents, antioxidants or combinations thereof. A more detailed description of the acceptable pharmaceutical excipients and methods for preparing them can be found in Remington, The Science and Practice of Pharmacy 21$^{st}$ ed. 2005, pp. 802-847 which are incorporated herein by reference. In an embodiment of the present disclosure, the liquid composition is an intravenous solution comprising 5% fluorinated glucose (50 mg/ml) in normal saline, sodium citrate and citric acid to adjust the pH to about 6.2.

It is estimated based upon the known pharmacokinetics for glucose and F$^{18}$DG that the amount of fluorinated glucose to be administered to a sample to allow imaging with an MRSI device in accordance with the present disclosure will be in the range of about 10 mg/kg to about 200 mg/kg, preferably about 25 mg/kg to about 100 mg/kg, more preferably about 35 mg/kg to about 65 mg/kg and most preferably about 50 mg/kg. A person of ordinary skill can easily calculate the amount of FDG to be administered to the sample and the amount of the solid or liquid composition described above that will provide the desired dosing range.

The fluorinated glucose composition should be administered to the patient under fasting conditions. Preferably, the patient should refrain from eating or drinking anything but water or black coffee for at least four (4) hours, preferably six (6) hours, prior to administration of the fluorinated glucose composition. Most preferably the patient should have a plasma glucose level of less than 150 mg/dL, preferably less than 125 mg/dL and most preferably 100 mg/dL or less at the time of administration. Once the fluorinated glucose composition is administered to the patient, the imaging should begin within 10 to 90 minutes, preferably within 20 to 60 minutes if the composition is administered intravenously and within 20 to 150 minutes, preferably within 30 to 120 minutes following oral administration.

Additional molecules other than fluorinated glucose and choline can be specifically prepared so as to enhance their capacity for detection and/or distinguishability using the SR and SSR technologies described herein. As a non-exclusive example, F$^{19}$ can be added singly or in multiples to many different molecules including pharmaceuticals (human and veterinary) cosmeceuticals and neutraceuticals, agricultural chemicals, proteins, carbohydrates, etc. In a preferred embodiment, CF$_3$, CHF$_2$, CH$_2$F, etc., groups could be substituted for CH$_3$ and all these groups attached to C, S, N, etc. and/or added to a wide variety of molecules so as to make the F$^{19}$ magnetization of the molecules easier to detect/distinguish.

Further, it is believed that existing fluorinated molecules such as FASLODEX (fulvestrant), NEXAVAR (sorafenib) STIVARGA (regorafenib), a non-radioactive form of AMYVID (fluorbetapir), BANZEL (rufinamide), ZELBORAF (vemurafenib) and 5-fluorouracil may be useful for imaging employing the SR and SSR technology described herein.

The SSR employed in the method for detecting and/or imaging fluorinated glucose and/or metabolites of fluorinated glucose in vivo in a subject that employs the SR and SSR technology described herein should comprise about 0.1 to about 1% by volume, preferably 0.5% by volume of FDG, FDG-6-P or a combination thereof. In a preferred embodiment, the SSR will comprise at least 10 grams of FDG alone, at least 10 grams of FDG-6-P alone or a combination of at least 10 grams of FDG and at least 10 grams of FDG-6-P.

As concluded by Ruiz-Cabello et al. in *Fluorine ($^{19}F$) MRS and MRI In Biomedicine*, NMR in Biomedicine, (2011); 24, 114-129 (hereinafter, "Ruiz-Cabello", which is incorporated by reference herein in its entirety), low SNR remains a challenge in imaging molecules including $^{19}F$ because of the intrinsically low $^{19}F$ concentrations in vivo. However, Applicants have appreciated that virtually all if not all of the techniques and molecules used and results obtained in Ruiz-Cabello can be improved upon drastically when imaging $^{19}F$ using superradiant techniques as disclosed herein, thus solving many long felt, but unresolved, problems in the field of MR imaging. As observed by Ruiz-Cabello, for $^{19}F$ MRI to produce an image quality similar to that of $^1H$ MRI, whose signal derives from nearly two-thirds of all nuclei present in the body, the agent benefits from a very high density of 19F nuclei on the molecule in addition to a high tissue concentration. Perfluorination can provide a comparable density of $^{19}F$ nuclei when one, more than one, or all $^1H$ nuclei on a hydrocarbon chain are replaced. Perfluorocarbons (PFCs) are molecules of similar structure to common organic compounds (e.g. alkanes), except that all of the hydrogen atoms are replaced by fluorine. These agents are well suited for medical applications.

Liquid PFCs have a low water solubility, which leads to slow diffusion and a long tenancy at the target site of the compound in its natural form. Although PFCs are lipophobic, because the degree of lipophobicity is commonly less than the hydrophobicity, PFCs tend to partition into the lipid component of cellular membranes and, in some cases, affect the cellular response to certain stimulants and stressors. The depth of penetration and the penetration rate can be modulated as a function of the particle size and the lipid solubility of emulsions prepared with different PFCs. PFCs are also characterized by a very low surface tension, which make them attractive for certain applications (e.g. intra-alveolar). An effective fluidity (viscosity) and a positive coefficient of spreading allow these molecules to spread evenly over a surface.

A first group of applications, based on the direct detection of fluorinated molecules using SR in accordance with the disclosure, cell tracking using PFC emulsions and in vivo monitoring of fluorinated drugs and their metabolites. An example is the use of $^{19}F$ superradiant MRS techniques for the detection of 5-fluorouracil (5-FU), a chemotherapeutic agent. As a result of the low tissue concentration of 5-FU (in the mmol/g wet weight range) and fluorine-containing pharmaceuticals used at clinical doses, the sensitivity of $^{19}F$ superradiant MRS and MRI depends primarily on the number of fluorine atoms present in the compound and the dose, in addition to the conventional factors that determine SNR, such as the magnetic field strength, detector design, and the like.

A second group of applications includes examples in which the fluorine molecules respond to a specific parameter, such as the presence of ligands. Fluorinated compounds are capable of detecting changes in oxygen, $H^+$ (pH), $Na^+$, $Ca^{2+}$ and $Mg^{2+}$ concentrations in biological tissues, and may therefore provide proxy measurements of these. Paramagnetic relaxation effects can be imparted by oxygen on $^{19}F$ nuclei, which cause changes in the spin-lattice relaxation rates ($1/T_1$), and can alter the chemical shift of one or more of the fluorine moieties. Changes associated with temperature and blood flow in the microenvironment may also affect the $^{19}F$ signals. In addition to the limits imposed by the low in vivo $^{19}F$ concentration of the agent being used, the utility of the $^{19}F$ agent as a proxy largely depends on the magnitude and sensitivity of the changes that are elicited.

Also included in this second group is the use of fluorinated emulsions in $^1H$ MRI applications. One type of PFC, PFOB, has been shown to be an effective negative contrast agent for delineating the bowel and improving bowel wall visualization. The bowel lumina appear homogeneously black on $T_1$- and $T_2$-weighted MR images because of the insolubility of PFOB in water and intestinal secretions.

Preparation and Chemical Stability of PFCs

The PFCs used in biomedical applications are chemically inert. They are derived synthetically, consist primarily of carbon and fluorine atoms, and are typically clear, colorless liquids that are insoluble in water. They should therefore be emulsified for clinically relevant applications involving intravenous injection, intraperitoneal injection, tissue intraparenchymal injection or administration in oxygen-permeable biodegradable and biocompatible capsules. The process is analogous to the routine preparation of lipid emulsions for parenteral nutrition. Despite the intrinsically low solubility, diffusivity, density and interfacial surface tension of PFCs, it is possible to generate stable nanoparticles of these compounds using a high-pressure micro-emulsifier. The latter deagglomerates and disperses submicrometer PFC particles uniformly in the fluid. This results in a smaller particle size compared with unpressurized emulsification, which, in turn, permits higher PFC concentrations—40% and higher—to be achieved. The nanoparticles obtained with this procedure typically have a very small size. Nominal particle sizes can range, for example, from about 100 nm-300 nm for various formulations, in any increment of 5 nm (e.g., about 150-250 nm, about 100-200 nm, about 200-300 nm, about 100-150 nm, about 150-200 nm, about 200-250 nm, about 250-300 nm, and the like). However, the stability of commercially available PFC preparations varies greatly, and there is a direct relationship between PFC stability and the clearance time from the body.

From a design standpoint, most clinical applications require stable preparations that are rapidly cleared from the body. For this reason, PFCs are commonly combined in commercial products to optimize the stability and clearance profile. For example, perfluorodecalin (PFDC) is rapidly cleared from the body, but forms emulsions that have poor stability. However, perfluorotripropylamine (PFTPA) forms stable emulsions that have a long retention time. By combining these two agents, emulsions such as Fluosol® achieve both a clinically acceptable stability and clearance profile. Nevertheless, Fluosol® emulsions remain stable for only about six hours after PFDC and PFTPA are mixed. Consequently, PFDC and PFTPA emulsions are stored frozen in separate solutions, and the solutions are thawed and mixed immediately prior to use. For practicality and other reasons, this version of the product was replaced in 1994 by a new PFDC/PFTPA preparation, Oxygent®, that has proven to be much more stable, and does not require frozen storage.

Perfluoropolyethers (PFPEs) (e.g. containing 12, 15 or 18 crown ethers) are excellent $^{19}F$ MRI contrast agents as they provide a single sharp resonance, eliminating any chemical shift artifact, maximizing the SNR and allowing an unambiguous identification of the PFC. Nanoparticle preparations of some of these agents are thermodynamically stable (they do not coalesce) and can be prepared using several different types of emulsifying agent that form a film around the dispersed globules of PFC. Typical emulsifying agents are surface-active agents, adsorbing at oil-water interfaces to form monomolecular films that reduce the interfacial surface tension. A large variety of agents have been used to improve the stability (lecithin is one of the most commonly used) and to increase the effective encapsulation of PFCs. In practice, combinations of emulsifiers are commonly used, rather than a single agent (e.g., safflower oil and lecithin, cholesterol and lecithin, etc.). This enables the modification and optimization of the balance between the hydrophilic and lipophilic parts of the emulsifier or mixture of emulsifiers.

The addition of other agents to a PFC emulsion can improve its performance from an MRI/MRS standpoint, but can also affect the stability of the preparation. For example, adding fluorescent lipids, cationic transfection reagents (lipofectamine) or targeted ligands to PFCs provides a means to FEC $\tau_R$'s as small as i msec have been produced. Thus the level of SNR enhancement for a fluorinated molecule with a t1 of 1 second is SQRT (1000) or ~32. Thus if 10 mM of a given molecule may be detected in a standard MRI/MRS experiment, using SR one could detect ~0.3 mM using SR enhanced MR technique described herein.

Applicant believes that $^{19}$F superradiant MRS can provide a highly specific tool for the investigation of drugs and their metabolic byproducts that contain fluorine atoms, which is also potentially suitable for quantification, particularly when combined with the teachings of superradiance herein. The most commonly used drugs in $^{19}$F conventional NMR are listed in Table 1. Their relative $^{19}$F SNRs, when present at a tissue concentration of 1 mmol/g wet weight, are also listed.

TABLE 1

List of $^{19}$F drugs and therapeutic agents

| Agent | Commercial name or acronym | Chemical formula | Modality | Application | Physical state | Relative SNR[a] (reference) |
|---|---|---|---|---|---|---|
| 5,5'-Difluoro-1,2-bis (o-amino-phenoxy) ethane—N,N,N',N'— tetraacetic acid | FBAPTA | $C_{22}H_{22}F_2N_2O_{10}$ | MRS | Calcium chelator | Solution | $2.1 \times 10^{-5}$ (46) |
| 5-Fluorouracil | Efudex ® | $C_4H_3FN_2O_2$ | MRI, MRS | Antineoplastic | Saline solution | $1.0 \times 10^{-5}$ (8, 12, 27, 30, 34, 36-38, 42, 105) |
| Flurbiprofen | Adfeed, Ansaid | $C_{15}H_{13}FO_2$ | MRS | Anti-inflammatory | Gel, oral tablets | $1.0 \times 10^{-5}$ (106) |
| Fluorodeoxyglucose | FDG | $C_6H_{11}FO_5$ | MRS | Inhibitor | Solution | $1.0 \times 10^{-5}$ (17)[b] |
| Deoxy-fluouridine (pro-drug) | Capecitabine (Xeloda ®) | $C_{15}H_{22}FN_3O_6$ | MRS | Prodrugs, antineoplastic | Oral tablets, injectable | $1.0 \times 10^{-5}$ (105, 107) |
| Fluoxetine hydrochloride | Prozac ® | $C_{17}H_{18}F_3NO$, HCl | MRS | Antidepressant | Capsule, liquid solutions | $3.1 \times 10^{-5}$ (108) |
| Fluvoxamine | Dumirox | $C_{15}H_{21}F_3N_2O_2$ | MRS | Antidepressant | Oral tablet | $3.1 \times 10^{-5}$ (109, 110) |
| Flurazepam | Dalmane, Felison | $C_{21}H_{23}ClFN_3O$ | MRS | Anti-anxiolytic | Capsule | $1.0 \times 10^{-5}$ (111) |
| Fluoexetine | Prozac ®, Sarafem ® | $C_{17}H_{18}F_3NO$ | MRS | Antidepressant | Capsule, syrup | $3.1 \times 10^{-5}$ (112, 113) |
| Floxuridine | Fudr ® | $C_9H_{11}FN_2O_5$ | MRS | Antineoplastic | Injectable | $1.0 \times 10^{-5}$ (107) |
| Gefinitib | Iressa ® | $C_{22}H_{24}ClFN_4O_3$ | MRS | Antineoplastic | Oral tablet | $1.0 \times 10^{-5}$ (114) |

[a] $^{19}$F signal-to-noise ratio (SNR) of the fluorinated agent at a concentration of 1 μmol/g wet tissue weight relative to the $^1$H signal detected from an equivalent tissue volume with a detector coil of the same geometry. The calculation assumes a tissue water content of 76.5% (±0.37 SD), which is an average of the water contents of brain, skeletal muscle and liver tissues (115), and sample-dominant noise resulting in a linear-dependent SNR with field strength.
[b] And references therein.

detect the agents by fluorescence microscopy, to enhance cellular labeling or to perform molecular imaging, respectively. A number of drugs, including antibacterial agents, vasoactive bronchodilators, mucolytic agents, glucocorticoids, antineoplastic agents and DNA, have also been incorporated into PFC emulsions without reducing their stability. These drugs offer significant value as the PFC phase can contain a high payload of hydrophobic drugs.

19F Superradiant MRS of Drug Metabolism

In one embodiment, SR enhances detection of molecules by increasing the available signal averaging rate. This permits molecules to be detected in concentrations lower than those that can be utilized in otherwise standard NMR/MRI/MRS experiments. The level of sensitivity increase, for a given magnetic field, RF coil depends on the ratio of $T1/\tau_R$ where $\tau_R$ as defined above the surperradiant time, the time required under SR conditions to return all magnetization to equilibrium.

Under standard clinical conditions T1 of many fluorinated molecules tend to be in the 1 second range in vivo. Using an The study of such drugs by $^{19}$F MRI/MRS tends to focus on their chemical structure, anabolism, catabolism, distribution and pharmacokinetics in vivo and in excised tissues. As an example, $^{19}$F MRS has been used widely in pharmacokinetic studies of the anticancer drug 5-FU. As an anticancer agent, 5-FU has been applied in concomitant radiotherapy and chemotherapy of different neoplastic diseases, particularly for neoplasms of the colorectal system, the head and neck, the trunk and some breast cancers. As a result of the intrinsic toxicity of 5-FU, different pro-drugs (a drug in its nonactive form) of the molecule have been designed to pass intact through the gastrointestinal tract, ultimately localizing and selectively converting to 5-FU in the malignant tissue, based on the higher activity of thymidine phosphorylase. Capecitabine is one such protodrug designed in an oral formulation to provide higher accumulation of 5-FU in the tumor, whilst reducing the exposure of healthy tissues to 5-FU. All of these techniques can be practiced using superradiant techniques as set forth herein. Such a practice is likely to lead to significantly improved results.

$^{19}$F Superradiant MRS of Extracellular Ph and Cations in Cells and Tissues

Applicant further believes that $^{19}$F superradiant MRS can also be useful for observing biological processes in complex systems, such as the maintenance of intracellular pH in different cell lines, and intracellular free calcium and magnesium levels via fluorinated chelates. A good exogenous Ph indicator should have favorable pharmacokinetics, i.e. an ionizable group with a pK value in the physiological range, good sensitivity and specificity, low toxicity, efficient cell penetration, fast exchange between acid and base forms, but slow exchange across cell membranes, and a large chemical shift range (10,40-43). The intracellular uptake and concentration should be high enough to provide adequate SNR from just the intracellular space. It is believed that the intracellular concentration of different cations can also be obtained from the change in the $^{19}$F superradiant NMR spectrum of an indicator cation to which it is bound. $Ca^{2+}$ plays an important role as a second messenger in living cells. $^{19}$F-based methods have been proposed for the determination of cytosolic calcium in cells and tissues. It is also possible to detection this cellular cation by way of the use of 1,2-bis(o-aminophenoxy) ethane-N,N,N',N'-tetraacetic acid (BAPTA). Here, the $^{19}$F-NMR $Ca^{2+}$ indicator is derived from its symmetrically 5,5-substituted difluoro-derivative (FBAPTA), which exhibits a chemical shift response on binding calcium. One issue for intracellular interrogation of any reporter molecule is the loading of the reporter molecule into cells. As tetracarboxylate does not penetrate the cell, a lipophilic agent, such as acetoxymethyl, is used. Other $^{19}$F-bearing ligands can be used ions such as Na+, Mg2+, Zn2+. Pb2+, etc. Examples of these ligands are presented in Yu J X et al., *19F: αVersatile Reporter for Non-Invasive Physiology and Pharmacology Using Magnetic Resonance*, Curr. Med. Chem. 2005; 12: 819-848, which is incorporated by reference herein in its entirety. Applicant submits that all of these techniques can be practiced using superradiant techniques as set forth herein.

Molecular and Cellular $^{19}$F Superradiant MRSI

MRI is able to visualize cells in vivo in real time. When cells are imaged in living animals, it can provide new insights into the biology of cell trafficking and migration. An example is the homing of white blood and hematopoietic cells in cancer and immunological diseases. Because MRI methods are noninvasive, they can be applied repeatedly to monitor targeted cells and cellular processes. For cells to be visualized by MRI, they generally must be labeled to enable their discrimination from surrounding tissue.

It is also possible to produce passively $^{19}$F fluorine-labeled macrophages. When imaged in accordance with superradiant techniques, these can be expected to appear as 'hotspots' in the central nervous system, for example in experimental allergic encephalomyelitis. This is an animal model for multiple sclerosis which is characterized by infiltration of the macrophages into the inflamed brain. After induction of the disease, cells can be observed after intravenous injection of a PFCE emulsion, such as at a dose of about 3 g/kg. PFCs can also be used in accordance with the SR teachings herein to image macrophage infiltration in the infarcted myocardium. Using different PFC preparations with different $^{19}$F spectral frequencies (as 'signatures'), Applicant believes it to be possible that multiple cell populations, labeled differently, can be detected simultaneously, when using SR techniques as described herein. PFCE can be used in different mixtures of lipids to formulate emulsified cationic and anionic nanoparticles, for example, including fluorescent rhodamine to tag different cells.

A different research area within molecular and cellular MRI is the use of transfected enzymes (reporter genes) that can convert a pro-(precursor) drug. In this technique, a gene with specific enzymatic activity is first introduced into tumor or other cells of interest. Then, a pro-drug is administered and, on internalization of the pro-drug into cells, it is converted by the transgene into an active drug. This method ensures that the drug will be active only in the target cells and will not affect other tissues. A similar example involves 5-FU, wherein yeast cytosine deaminase is introduced into an HT29 colon carcinoma cell line to convert the precursor 5-fluorocytosine (5-FC) into 5-FU, and elicit a chemotherapeutic response. The formation of 5-FU, measured in xenografted tumors using $^{19}$F MRS, when employing superradiant techniques as described herein, can provide an indication of the efficacy of drug delivery. By this technique, Applicants believe that $^{19}$F superradiant MRS can provide a means of monitoring and optimizing the administration of such pro-drugs to patients for chemotherapy.

With regard to the use of $^{19}$F probes as 'smart tracers' or 'molecular beacons', Applicant believes that $^{19}$F superradiant MRS can be employed to probe the enzymatic activity of a prototype reporter enzyme, b-galactosidase. This enzyme has been shown to liberate aglycone from the substrate 4-fluoro-2-nitrophenyl-b-D-galactopyranoside, resulting in a pH-dependent 19F chemical shift of 5-10 ppm that can be used to measure intracellular pH. Other enzymes can be probed as well. For example, certain proteases (caspase-3), which are overexpressed in tumors, are able to cleave paramagnetic chelates from fluorinated molecules, thereby modulating $^{19}$F relaxation times and signal intensity. Finally, temperature-sensitive liposomes containing $^{19}$F tracers have been developed as beacons for image-guided drug delivery. Applicant believes that each of these examples can be practiced using superradiant imaging techniques as provided herein with superior results.

In addition to enzymes, fluorinated metabolic substrates are also potential targets of study that are accessible to $^{19}$F superradiant MRI or MRS, when present in sufficient concentration. For example, the distribution of 2-fluoro-[18F]-2-deoxy-glucose, a widely used positron emission tomography probe for the measurement of abnormal glucose consumption in tumors and ischemia, has been monitored with 19F MRS after replacing the unstable $^{18}$F atom with $^{19}$F.

Incorporation of PFCs Into Cellular Therapeutic Biomaterials

The incorporation of PFCs into biomaterials is attractive for a number of reasons. By exploiting the various features of PFCs, fluorinated biomaterials can be used to create smart scaffolds that are capable of producing an oxygen-rich environment whilst permitting the noninvasive assessment of biological parameters, such as $O_2$ tension, pH and metabolite concentrations, with $^{19}$F MRI. Applicant believes that fluorinated biomaterials, in conjunction with $^{19}$F superradiant MRI, can provide important information on the delivery and long-term survival of cellular therapeutics. For these reasons, fluorinated biomaterials show promise for both the assessment and enhancement of the long-term viability of cellular therapeutics after transplantation, particularly when employing SR techniques.

To date, the use of fluorinated biomaterials generally in the art has been limited to PFC-containing microcapsules. The use of microcapsules to provide the immuno-isolation of cellular therapeutics has clinical potential for a wide range of diseases that require enzyme or endocrine replacement therapy. Applicant believes that its is possible to incorporate PFPE emulsions in alginate/poly-L-lysine (PLL) microcapsules to enable the assessment of the biodistribution and integrity of microcapsules with SR MRI. As PFCs are rapidly cleared from the body when they are no longer encapsulated, it is believed that SR MRI can provide a means of assessing capsule rupture and loss of immunoprotection.

Improved MRS

Magnetic Resonance Spectroscopy is concerned with the identification of target molecules, usually in vivo, that are associated with specific disease states or other pathologies. This process is often complicated by the fact that the in vivo environment has many molecules in it that crowd the MR spectrum.

Applicant has discovered that by adjusting the parameters of the feedback field generated in SR conditions individual resonances can be highlighted or suppressed as desired. In a preferred embodiment, the phase, gain or both of the FEC are adjusted so as to influence the frequency spectrum that is obtained as a result of carrying out a Fourier Transform (FT) of the SR time domain pulse. Specifically, the size and width of a target resonance can be increased or decreased as desired, highlighting it or suppressing it relative to other resonances. Similarly, the frequency position of a target resonance may be shifted as a result of adjusting the one or both of the gain and phase of the FEC.

Unlike traditional FT MRS, the FT of an SR peak cannot be a priori associated with specific positions in the frequency spectrum and hence, without additional information, identified with a particular molecule. In this case the additional information is the known composition and quantity of the molecules in the SSR, which the operator may select in advance. Selection of the molecules in the SSR, as well as control over the FEC, allows the operator to know which molecules in the sample or subject are in SR conditions, and which are not. Thus observation of the SR pulse, as well as the FT of that pulse, can be used to carry out identification and/or quantification of a target molecule or molecules.

Figure 5:
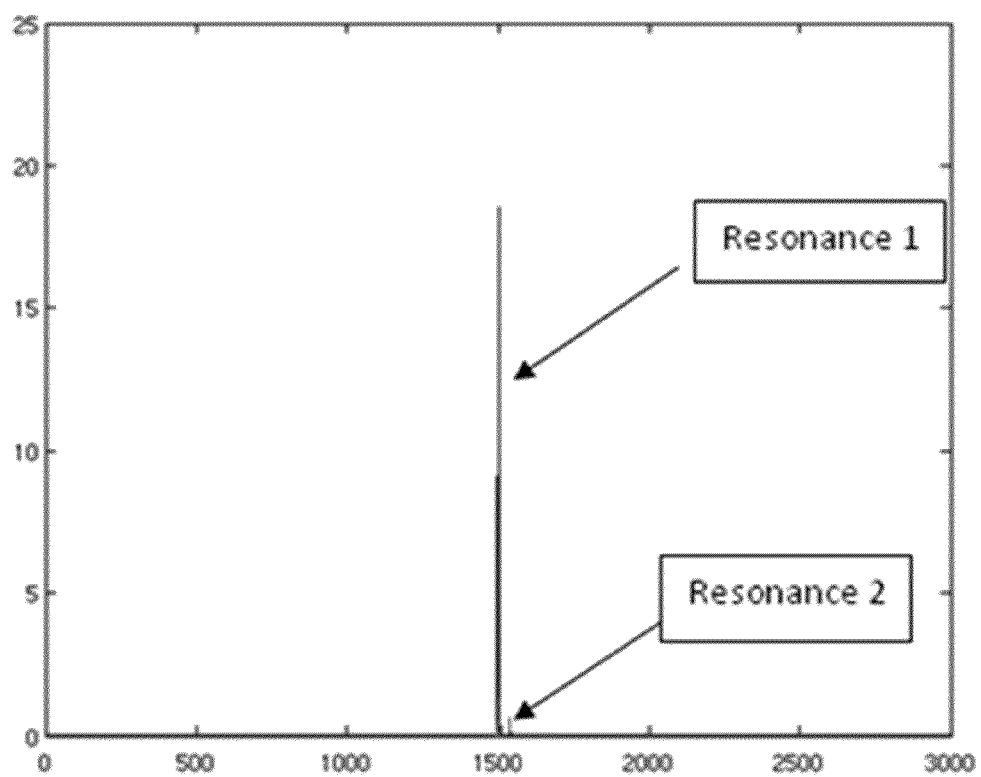
FIG. 5 shows the result of a Fourier Transform of the SR pulse resulting from inversion of a simulated sample containing equal amounts of two resonances labeled 1 and 2 that are 10 ppm apart. In a standard NMR protocol, the peaks would be equal in height as the simulation sets equal amounts of resonances 1 and 2 in the "sample". The ratio of the peak heights in the data shown is ~31. As can be seen, resonance 1 has been highlighted and resonance 2 has been suppressed. The data shown is taken only from the "sample" and does not include any signal from the simulated SSR which was set to contain a large amount of resonance 1. The "y" axis is in arbitrary units and the "x" axis in frequency units.

FIG. 5 shows the result of a Fourier Transform of the SR pulse resulting from inversion of a simulated sample containing equal amounts of two resonances labelled 1 and 2. The simulation assumes that inside the SSR is a large amount of resonance 1 whose identity and quantity are known to the operator. The phase angle of the "FEC" was set to −120 degrees and the gain to 4 (arbitrary units in this simulation). The result is that the ratio of the peak of resonance 1 to resonance 2, which would be 1 in a traditional MR protocol, is 31 times greater after the resultant SR pulse is Fourier Transformed. This makes it much easier to identify the presence and quantity of Resonance 1.

In some embodiments, spatially encoded electromagnetic feedback can be induced at least in part by substantially eliminating the presence of a gradient magnetic field in the at least one region of interest while maintaining it in others. In this context "spatially encoded electromagnetic feedback" means arranging for feedback to occur in one or more regions of interest of a sample or subject, while suppressing it in others. The region of interest can include, for example, at least one voxel, and the at least one gradient coil can be adapted and configured to apply a magnetic field gradient in at least one of three mutually orthogonal directions. This permits spectroscopic identification of target molecules in selected regions of space.

Exemplary MRI Scanner Systemization

Figure 6:
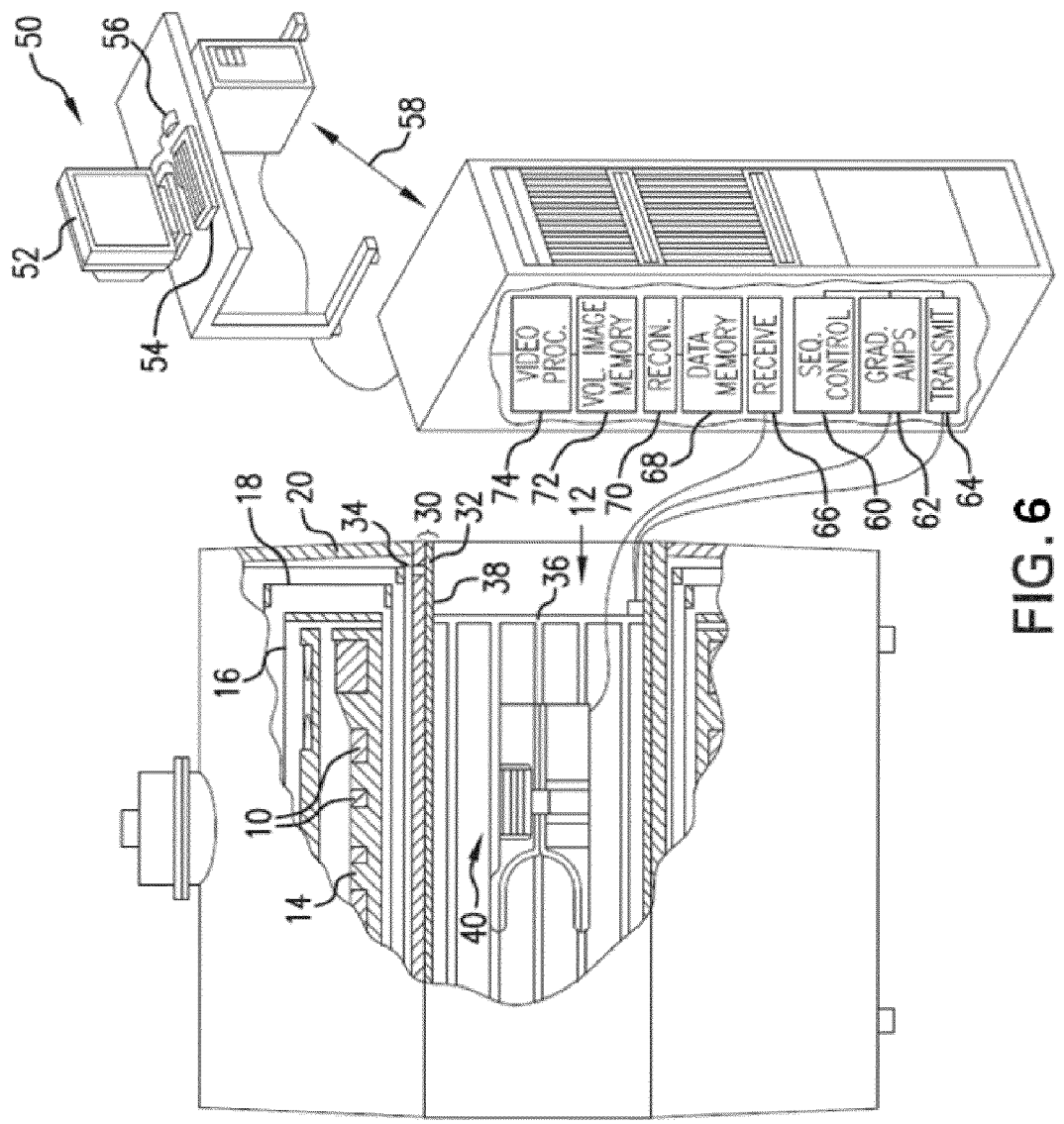
FIG. 6 depicts aspects of an exemplary MR imaging system in accordance with the disclosure.

An exemplary magnetic resonance system is depicted in FIG. 6, and includes a plurality of primary magnetic coils 10 that generate a uniform, temporally constant magnetic field $B_0$ along a longitudinal or z-axis of a central bore 12 of the device. In a preferred superconducting embodiment, the primary magnet coils are supported by a former 14 and received in a toroidal helium vessel or can 16. The vessel is filled with helium to maintain the primary magnet coils at superconducting temperatures. The can is surrounded by a series of cold shields 18 which are supported in a vacuum Dewar 20. Of course, annular resistive magnets, C-magnets, and the like are also contemplated.

A whole body gradient coil assembly 30 includes x, y, and z-coils mounted along the bore 12 for generating gradient magnetic fields, Gx, Gy, and Gz. Preferably, the gradient coil assembly is a self-shielded gradient coil that includes primary x, y, and z-coil assemblies 32 potted in a dielectric former and secondary x, y, and z-coil assemblies 34 that are supported on a bore defining cylinder of the vacuum Dewar 20. A whole body radio frequency coil 36 can be mounted inside the gradient coil assembly 30. A whole body radio frequency shield 38, e.g., copper mesh, can be mounted between the whole body RF coil 36 and the gradient coil assembly 30. If desired, an insertable radio frequency coil 40 can be removably mounted in the bore in an examination region defined around an isocenter of the magnet 10. In the embodiment of FIG. 2, the insertable radio frequency coil is a head and neck coil for imaging one or both of patient's head and neck, but other extremity coils can be provided, such as back coils for imaging the spine, knee coils, shoulder coils, breast coils, wrist coils and the like.

With continuing reference to FIG. 6, an operator interface and control station is provided that includes a human-readable display, such as a video monitor 52, and operator input devices such as a keyboard 54, a mouse 56, a trackball, light pen, or the like. A computer control and reconstruction module 58 is also provided that includes hardware and software for enabling the operator to select among a plurality of pre-programmed magnetic resonance sequences that are stored in a sequence control memory, if rf pulses are to be used as a part of the imaging study. A sequence controller 60 controls gradient amplifiers 62 connected with the gradient coil assembly 30 for causing the generation of the Gx, Gy, and Gz gradient magnetic fields at appropriate times during the selected gradient sequence and a digital transmitter 64 which causes a selected one of the whole body and insertable radio frequency coils to generate $B_1$ radio frequency field pulses at times appropriate to the selected sequence, if rf pulses are to be used in the study.

MR signals received by the coil 40 are demodulated by a digital receiver 66 and stored in a data memory 68. The data from the data memory are reconstructed by a reconstruction or array processor 70 into a volumetric image representation that is stored in an image memory 72. If a phased array is used as the receiving coil assembly, the image can be reconstructed from the coil signals. A video processor 74 under operator control converts selected portions of the volumetric image representation into slice images, projection images, perspective views, or the like as is conventional in the art for display on the video monitor.

Example—MKT™ Controller

Figure 7:
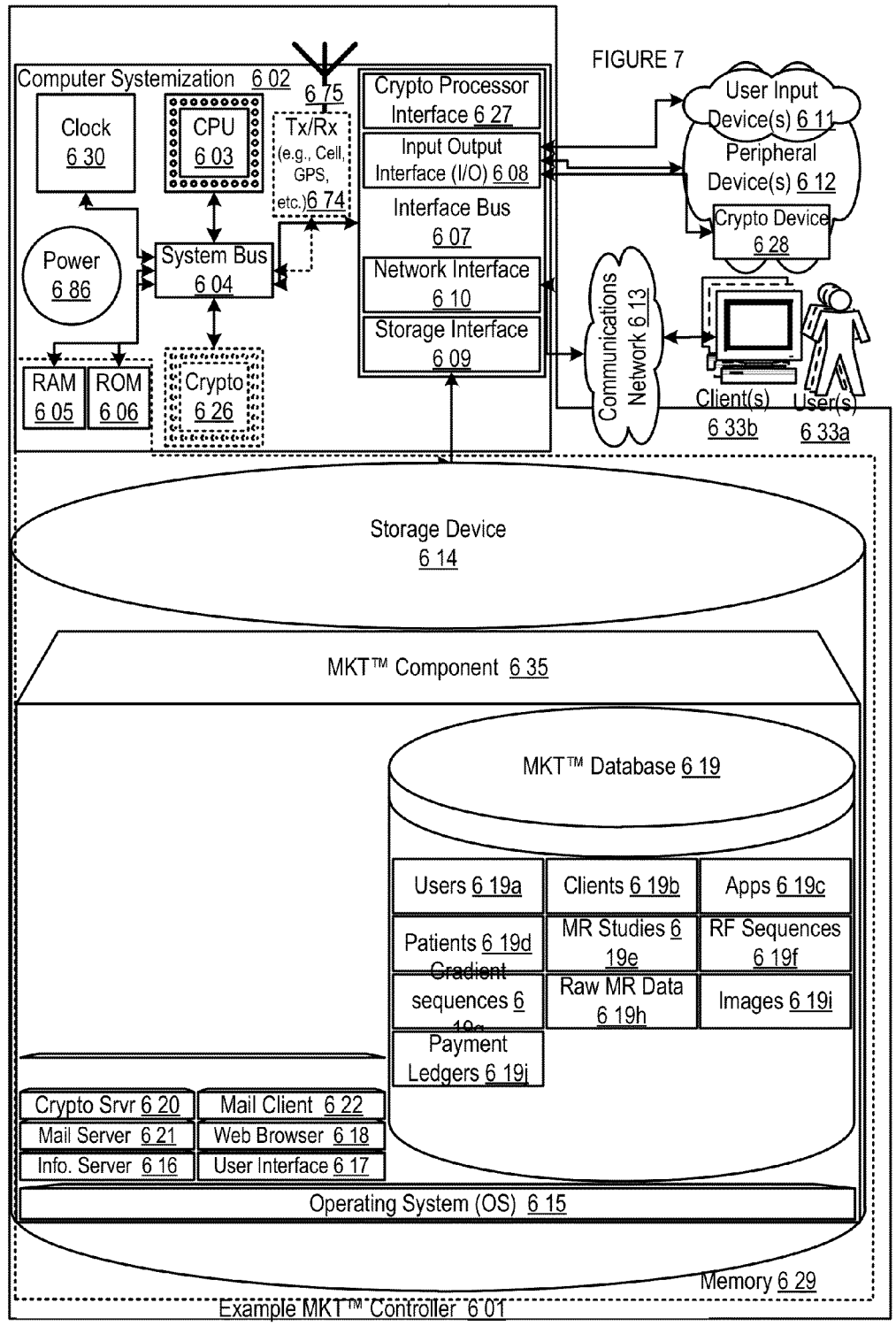
FIG. 7 depicts aspects of an exemplary computer system in accordance with the disclosure for operating a magnetic resonance system.

FIG. 7 illustrates inventive aspects of a MKT™ controller 601 for controlling a system such as that illustrated in FIG. 6 implementing some of the embodiments disclosed herein. In this embodiment, the MKT™ controller 601 may serve to aggregate, process, store, search, serve, identify, instruct, generate, match, and/or facilitate interactions with a computer through various technologies, and/or other related data.

With respect to the controller 601, typically, a user or users, e.g., 633a, which may be people or groups of users and/or other systems, may engage information technology systems (e.g., computers) to facilitate operation of the system and information processing. In turn, computers employ processors to process information; such processors 603 may be referred to as central processing units (CPU). One form of processor is referred to as a microprocessor. CPUs use communicative circuits to pass binary encoded signals acting as instructions to enable various operations. These instructions may be operational and/or data instructions containing and/or referencing other instructions and data in various processor accessible and operable areas of memory 629 (e.g., registers, cache memory, random access memory, etc.). Such communicative instructions may be stored and/or transmitted in batches (e.g., batches of instructions) as programs and/or data components to facilitate desired operations. These stored instruction codes, e.g., programs, may engage the CPU circuit components and other motherboard and/or system components to perform desired operations. One type of program is a computer operating system, which may be executed by CPU on a computer; the operating system enables and facilitates users to access and operate computer information technology and resources. Some resources that may be employed in information technology systems include: input and output mechanisms through which data may pass into and out of a computer; memory storage into which data may be saved; and processors by which information may be processed. These information technology systems may be used to collect data for later retrieval, analysis, and manipulation, which may be facilitated through a database program. These information technology systems provide interfaces that allow users to access and operate various system components.

In one embodiment, the MKT™ controller 601 may be connected to and/or communicate with entities such as, but not limited to: one or more users from user input devices 611; peripheral devices 612, components of the magnetic resonance system; an optional cryptographic processor device 628; and/or a communications network 613. For example, the MKT™ controller 601 may be connected to and/or communicate with users, e.g., 633a, operating client device(s), e.g., 633b, including, but not limited to, personal computer(s), server(s) and/or various mobile device(s) including, but not limited to, cellular telephone(s), smartphone(s) (e.g., iPhone®, Blackberry®, Android OS-based phones etc.), tablet computer(s) (e.g., Apple iPad™, HP Slate™, Motorola Xoom™, etc.), eBook reader(s) (e.g., Amazon Kindle™, Barnes and Noble's Nook™ eReader, etc.), laptop computer(s), notebook(s), netbook(s), gaming console(s) (e.g., XBOX Live™, Nintendo® DS, Sony PlayStation® Portable, etc.), portable scanner(s) and/or the like.

Networks are commonly thought to comprise the interconnection and interoperation of clients, servers, and intermediary nodes in a graph topology. It should be noted that the term "server" as used throughout this application refers generally to a computer, other device, program, or combination thereof that processes and responds to the requests of remote users across a communications network. Servers serve their information to requesting "clients." The term "client" as used herein refers generally to a computer, program, other device, user and/or combination thereof that is capable of processing and making requests and obtaining and processing any responses from servers across a communications network. A computer, other device, program, or combination thereof that facilitates, processes information and requests, and/or furthers the passage of information from a source user to a destination user is commonly referred to as a "node." Networks are generally thought to facilitate the transfer of information from source points to destinations. A node specifically tasked with furthering the passage of information from a source to a destination is commonly called a "router." There are many forms of networks such as Local Area Networks (LANs), Pico networks, Wide Area Networks (WANs), Wireless Networks (WLANs), etc. For example, the Internet is generally accepted as being an interconnection of a multitude of networks whereby remote clients and servers may access and interoperate with one another.

The MKT™ controller 601 may be based on computer systems that may comprise, but are not limited to, components such as: a computer systemization 602 connected to memory 629.

Computer Systemization

A computer systemization 602 may comprise a clock 630, central processing unit ("CPU(s)" and/or "processor(s)" (these terms are used interchangeable throughout the disclosure unless noted to the contrary)) 603, a memory 629 (e.g., a read only memory (ROM) 606, a random access memory (RAM) 605, etc.), and/or an interface bus 607, and most frequently, although not necessarily, are all interconnected and/or communicating through a system bus 604 on one or more (mother)board(s) 602 having conductive and/or otherwise transportive circuit pathways through which instructions (e.g., binary encoded signals) may travel to effect communications, operations, storage, etc. Optionally, the computer systemization may be connected to an internal power source 686; e.g., optionally the power source may be internal. Optionally, a cryptographic processor 626 and/or transceivers (e.g., ICs) 674 may be connected to the system bus. In another embodiment, the cryptographic processor and/or transceivers may be connected as either internal and/or external peripheral devices 612 via the interface bus I/O. In turn, the transceivers may be connected to antenna(s) 675, thereby effectuating wireless transmission and reception of various communication and/or sensor protocols; for example the antenna(s) may connect to: a Texas Instruments WiLink WL1283 transceiver chip (e.g., providing 802.11n, Bluetooth 3.0, FM, global positioning system (GPS) (thereby allowing MKT™ controller to determine its location)); Broadcom BCM4329 FKUBG transceiver chip (e.g., providing 802.11n, Bluetooth 2.1+EDR, FM, etc.); a Broadcom BCM4750 IUB8 receiver chip (e.g., GPS); an Infineon Technologies X-Gold 618-PMB9800 (e.g., providing 2G/3G HSDPA/HSUPA communications); and/or the like. The system clock typically has a crystal oscillator and generates a base signal through the computer systemization's circuit pathways. The clock is typically coupled to the system bus and various clock multipliers that will increase or decrease the base operating frequency for other components interconnected in the computer systemization. The clock and various components in a computer systemization drive signals embodying information throughout the system. Such transmission and reception of instructions embodying information throughout a computer systemization may be commonly referred to as communications. These communicative instructions may further be transmitted, received, and the cause of return and/or reply communications beyond the instant computer systemization to: communications networks, input devices, other computer systemizations, peripheral devices, and/or the like. Of course, any of the above components may be connected directly to one another, connected to the CPU, and/or organized in numerous variations employed as exemplified by various computer systems.

The CPU comprises at least one high-speed data processor adequate to execute program components for executing user and/or system-generated requests. Often, the processors themselves will incorporate various specialized processing units, such as, but not limited to: integrated system (bus) controllers, memory management control units, floating point units, and even specialized processing sub-units like graphics processing units, digital signal processing units, and/or the like. Additionally, processors may include internal fast access addressable memory, and be capable of mapping and addressing memory 629 beyond the processor itself; internal memory may include, but is not limited to: fast registers, various levels of cache memory (e.g., level 1, 2, 3, etc.), RAM, etc. The processor may access this memory through the use of a memory address space that is accessible via instruction address, which the processor can construct and decode allowing it to access a circuit path to a specific memory address space having a memory state. The CPU may be a microprocessor such as: AMD's Athlon, Duron and/or Opteron; ARM's application, embedded and secure processors; IBM and/or Motorola's DragonBall and PowerPC; IBM's and Sony's Cell processor; Intel's Celeron, Core (2) Duo, Itanium, Pentium, Xeon, and/or XScale; and/or the like processor(s). The CPU interacts with memory through instruction passing through conductive and/or transportive conduits (e.g., (printed) electronic and/or optic circuits) to execute stored instructions (i.e., program code) according to conventional data processing techniques. Such instruction passing facilitates communication within the MKT™ controller and beyond through various interfaces. Should processing requirements dictate a greater amount speed and/or capacity, distributed processors (e.g., Distributed MKT™ embodiments), mainframe, multi-core, parallel, and/or supercomputer architectures may similarly be employed. Alternatively, should deployment requirements dictate greater portability, smaller Personal Digital Assistants (PDAs) may be employed.

Depending on the particular implementation, features of the MKT™ implementations may be achieved by implementing a microcontroller such as CAST's R8051XC2 microcontroller; Intel's MCS 51 (i.e., 8051 microcontroller); and/or the like. Also, to implement certain features of the MKT™ embodiments, some feature implementations may rely on embedded components, such as: Application-Specific Integrated Circuit ("ASIC"), Digital Signal Processing ("DSP"), Field Programmable Gate Array ("FPGA"), and/or the like embedded technology. For example, any of the MKT™ component collection (distributed or otherwise) and/or features may be implemented via the microprocessor and/or via embedded components; e.g., via ASIC, coprocessor, DSP, FPGA, and/or the like. Alternately, some implementations of the MKT™ may be implemented with embedded components that are configured and used to achieve a variety of features or signal processing.

Depending on the particular implementation, the embedded components may include software solutions, hardware solutions, and/or some combination of both hardware/software solutions. For example, MKT™ features discussed herein may be achieved through implementing FPGAs, which are a semiconductor devices containing programmable logic components called "logic blocks", and programmable interconnects, such as the high performance FPGA Virtex series and/or the low cost Spartan series manufactured by Xilinx. Logic blocks and interconnects can be programmed by the customer or designer, after the FPGA is manufactured, to implement any of the MKT™ features. A hierarchy of programmable interconnects allow logic blocks to be interconnected as needed by the MKT™ system designer/administrator, somewhat like a one-chip programmable breadboard. An FPGA's logic blocks can be programmed to perform the function of basic logic gates such as AND, and XOR, or more complex combinational functions such as decoders or simple mathematical functions. In most FPGAs, the logic blocks also include memory elements, which may be simple flip-flops or more complete blocks of memory. In some circumstances, the MKT™ may be developed on regular FPGAs and then migrated into a fixed version that more resembles ASIC implementations. Alternate or coordinating implementations may migrate MKT™ controller features to a final ASIC instead of or in addition to FPGAs. Depending on the implementation all of the aforementioned embedded components and microprocessors may be considered the "CPU" and/or "processor" for the MKT™.

Power Source

The power source 686 may be of any standard form for powering small electronic circuit board devices such as the following power cells: alkaline, lithium hydride, lithium ion, lithium polymer, nickel cadmium, solar cells, and/or the like. Other types of AC or DC power sources may be used as well. In the case of solar cells, in one embodiment, the case provides an aperture through which the solar cell may capture photonic energy. The power cell 686 is connected to at least one of the interconnected subsequent components of the MKT' thereby providing an electric current to all subsequent components. In one example, the power source 686 is connected to the system bus component 604. In an alternative embodiment, an outside power source 686 is provided through a connection across the I/O 608 interface. For example, a USB and/or IEEE 1394 connection carries both data and power across the connection and is therefore a suitable source of power.

Interface Adapters

Interface bus(ses) 607 may accept, connect, and/or communicate to a number of interface adapters, conventionally although not necessarily in the form of adapter cards, such as but not limited to: input output interfaces (I/O) 608, storage interfaces 609, network interfaces 610, and/or the like. Optionally, cryptographic processor interfaces 627 similarly may be connected to the interface bus. The interface bus provides for the communications of interface adapters with one another as well as with other components of the computer systemization. Interface adapters are adapted for a compatible interface bus. Interface adapters conventionally connect to the interface bus via a slot architecture. Conventional slot architectures may be employed, such as, but not limited to: Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and/or the like.

Storage interfaces 609 may accept, communicate, and/or connect to a number of storage devices such as, but not limited to: storage devices 614, removable disc devices, and/or the like. Storage interfaces may employ connection protocols such as, but not limited to: (Ultra) (Serial) Advanced Technology Attachment (Packet Interface) ((Ultra) (Serial) ATA(PI)), (Enhanced) Integrated Drive Electronics ((E)IDE), Institute of Electrical and Electronics Engineers (IEEE) 1394, fiber channel, Small Computer Systems Interface (SCSI), Universal Serial Bus (USB), and/or the like.

Network interfaces 610 may accept, communicate, and/or connect to a communications network 613. Through a communications network 613, the MKT™ controller is accessible through remote clients 633b (e.g., computers with web browsers) by users 633a. Network interfaces may employ connection protocols such as, but not limited to: direct connect, Ethernet (thick, thin, twisted pair 10/100/1000 Base T, and/or the like), Token Ring, wireless connection such as IEEE 802.11a-x, and/or the like. Should processing requirements dictate a greater amount speed and/or capacity, distributed network controllers (e.g., Distributed MKT™), architectures may similarly be employed to pool, load balance, and/or otherwise increase the communicative bandwidth required by the MKT™ controller. A communications network may be any one and/or the combination of the following: a direct interconnection; the Internet; a Local Area Network (LAN); a Metropolitan Area Network (MAN); an Operating Missions as Nodes on the Internet (OMNI); a secured custom connection; a Wide Area Network (WAN); a wireless network (e.g., employing protocols such as, but not limited to a Wireless Application Protocol (WAP), I-mode, and/or the like); and/or the like. A network interface may be regarded as a specialized form of an input output interface. Further, multiple network interfaces 610 may be used to engage with various communications network types 613. For example, multiple network interfaces may be employed to allow for the communication over broadcast, multicast, and/or unicast networks.

Input Output interfaces (I/O) 608 may accept, communicate, and/or connect to user input devices 611, peripheral devices 612, cryptographic processor devices 628, and/or the like. I/O may employ connection protocols such as, but not limited to: audio: analog, digital, monaural, RCA, stereo, and/or the like; data: Apple Desktop Bus (ADB), IEEE 1394a-b, serial, universal serial bus (USB); infrared; joystick; keyboard; midi; optical; PC AT; PS/2; parallel; radio; video interface: Apple Desktop Connector (ADC), BNC, coaxial, component, composite, digital, Digital Visual Interface (DVI), high-definition multimedia interface (HDMI), RCA, RF antennae, S-Video, VGA, and/or the like; wireless transceivers: 802.11a/b/g/n/x; Bluetooth; cellular (e.g., code division multiple access (CDMA), high speed packet access (HSPA(+)), high-speed downlink packet access (HSDPA), global system for mobile communications (GSM), long term evolution (LTE), WiMax, etc.); and/or the like. One typical output device may include a video display, which typically comprises a Cathode Ray Tube (CRT) or Liquid Crystal Display (LCD) based monitor with an interface (e.g., DVI circuitry and cable) that accepts signals from a video interface, may be used. The video interface composites information generated by a computer systemization and generates video signals based on the composited information in a video memory frame. Another output device is a television set, which accepts signals from a video interface. Typically, the video interface provides the composited video information through a video connection interface that accepts a video display interface (e.g., an RCA composite video connector accepting an RCA composite video cable; a DVI connector accepting a DVI display cable, etc.).

User input devices 611 often are a type of peripheral device 612 (see below) and may include: card readers, dongles, finger print readers, gloves, graphics tablets, joysticks, keyboards, microphones, mouse (mice), remote controls, retina readers, touch screens (e.g., capacitive, resistive, etc.), trackballs, trackpads, sensors (e.g., accelerometers, ambient light, GPS, gyroscopes, proximity, etc.), styluses, and/or the like.

Peripheral devices 612, such as other components of the MR system, including signal generators in communication with RF coils, receivers in communication with RF coils, the gradient coil system, main magnet system and the like may be connected and/or communicate to I/O and/or other facilities of the like such as network interfaces, storage interfaces, directly to the interface bus, system bus, the CPU, and/or the like. Peripheral devices may be external, internal and/or part of the MKT™ controller. Peripheral devices may also include: antenna, audio devices (e.g., line-in, line-out, microphone input, speakers, etc.), cameras (e.g., still, video, webcam, etc.), dongles (e.g., for copy protection, ensuring secure transactions with a digital signature, and/or the like), external processors (for added capabilities; e.g., crypto devices 628), force-feedback devices (e.g., vibrating motors), network interfaces, printers, scanners, storage devices, transceivers (e.g., cellular, GPS, etc.), video devices (e.g., goggles for functional imaging, for example, monitors, etc.), video sources, visors, and/or the like. Peripheral devices often include types of input devices (e.g., cameras).

Cryptographic units such as, but not limited to, microcontrollers, processors 626, interfaces 627, and/or devices 628 may be attached, and/or communicate with the MKT™ controller. A MC68HC16 microcontroller, manufactured by Motorola Inc., may be used for and/or within cryptographic units. The MC68HC16 microcontroller utilizes a 16-bit multiply-and-accumulate instruction in the 16 MHz configuration and requires less than one second to perform a 512-bit RSA private key operation. Cryptographic units support the authentication of communications from interacting agents, as well as allowing for anonymous transactions. Cryptographic units may also be configured as part of CPU. Equivalent microcontrollers and/or processors may also be used. Other commercially available specialized cryptographic processors include: the Broadcom's CryptoNetX and other Security Processors; nCipher's nShield, SafeNet's Luna PCI (e.g., 7100) series; Semaphore Communications' 40 MHz Roadrunner 184; Sun's Cryptographic Accelerators (e.g., Accelerator 6000 PCIe Board, Accelerator 500 Daughtercard); Via Nano Processor (e.g., L2100, L2200, U2400) line, which is capable of performing 500+ MB/s of cryptographic instructions; VLSI Technology's 33 MHz 6868; and/or the like.

Memory

Generally, any mechanization and/or embodiment allowing a processor to affect the storage and/or retrieval of information is regarded as memory 629 (or 68, 72, etc.). However, memory is a fungible technology and resource, thus, any number of memory embodiments may be employed in lieu of or in concert with one another. It is to be understood that the MKT™ controller and/or a computer systemization may employ various forms of memory 629. For example, a computer systemization may be configured wherein the functionality of on-chip CPU memory (e.g., registers), RAM, ROM, and any other storage devices are provided by a paper punch tape or paper punch card mechanism; of course such an embodiment would result in an extremely slow rate of operation. In a typical configuration, memory 629 will include ROM 606, RAM 605, and a storage device 614. A storage device 614 may be any conventional computer system storage. Storage devices may include a drum; a (fixed and/or removable) magnetic disk drive; a magneto-optical drive; an optical drive (i.e., Blueray, CD ROM/RAM/Recordable (R)/ReWritable (RW), DVD R/RW, HD DVD R/RW etc.); an array of devices (e.g., Redundant Array of Independent Disks (RAID)); solid state memory devices (USB memory, solid state drives (SSD), etc.); other processor-readable storage mediums; and/or other devices of the like. Thus, a computer systemization generally requires and makes use of memory.

Component Collection

The memory 629 may contain a collection of program and/or database components and/or data such as, but not limited to: operating system component(s) 615 (operating system); information server component(s) 616 (information server); user interface component(s) 617 (user interface); Web browser component(s) 618 (Web browser); database(s) 619; mail server component(s) 621; mail client component(s) 622; cryptographic server component(s) 620 (cryptographic server) and/or the like (i.e., collectively a component collection). These components may be stored and accessed from the storage devices and/or from storage devices accessible through an interface bus. Although non-conventional program components such as those in the component collection, typically, are stored in a local storage device 614, they may also be loaded and/or stored in memory such as: peripheral devices, RAM, remote storage facilities through a communications network, ROM, various forms of memory, and/or the like.

Operating System

The operating system component 615 is an executable program component facilitating the operation of the MKT™ controller. Typically, the operating system facilitates access of I/O, network interfaces, peripheral devices, storage devices, and/or the like. The operating system may be a highly fault tolerant, scalable, and secure system such as: Apple Macintosh OS X (Server); AT&T Nan 9; Be OS; Unix and Unix-like system distributions (such as AT&T's UNIX; Berkley Software Distribution (BSD) variations such as FreeBSD, NetBSD, OpenBSD, and/or the like; Linux distributions such as Red Hat, Ubuntu, and/or the like); and/or the like operating systems. However, more limited and/or less secure operating systems also may be employed such as Apple Macintosh OS, IBM OS/2, Microsoft DOS, Microsoft Windows 2000/2003/3.1/95/98/CE/Millenium/NT/Vista/XP (Server), Palm OS, and/or the like. An operating system may communicate to and/or with other components in a component collection, including itself, and/or the like. Most frequently, the operating system communicates with other program components, user interfaces, and/or the like. For example, the operating system may contain, communicate, generate, obtain, and/or provide program component, system, user, and/or data communications, requests, and/or responses. The operating system, once executed by the CPU, may enable the interaction with communications networks, data, I/O, peripheral devices, program components, memory, user input devices, and/or the like. The operating system may provide communications protocols that allow the MKT™ controller to communicate with other entities through a communications network 613. Various communication protocols may be used by the MKT™ controller as a subcarrier transport mechanism for interaction, such as, but not limited to: multicast, TCP/IP, UDP, unicast, and/or the like.

Information Server

An information server component 616 is a stored program component that is executed by a CPU. The information server may be a conventional Internet information server such as, but not limited to Apache Software Foundation's Apache, Microsoft's Internet Information Server, and/or the like. The information server may allow for the execution of program components through facilities such as Active Server Page (ASP), ActiveX, (ANSI) (Objective-) C (++), C# and/or .NET, Common Gateway Interface (CGI) scripts, dynamic (D) hypertext markup language (HTML), FLASH, Java, JavaScript, Practical Extraction Report Language (PERL), Hypertext Pre-Processor (PHP), pipes, Python, wireless application protocol (WAP), WebObjects, and/or the like. The information server may support secure communications protocols such as, but not limited to, File Transfer Protocol (FTP); HyperText Transfer Protocol (HTTP); Secure Hypertext Transfer Protocol (HTTPS), Secure Socket Layer (SSL), messaging protocols (e.g., America Online (AOL) Instant Messenger (AIM), Application Exchange (APEX), ICQ, Internet Relay Chat (IRC), Microsoft Network (MSN) Messenger Service, Presence and Instant Messaging Protocol (PRIM), Internet Engineering Task Force's (IETF's) Session Initiation Protocol (SIP), SIP for Instant Messaging and Presence Leveraging Extensions (SIMPLE), open XML-based Extensible Messaging and Presence Protocol (XMPP) (i.e., Jabber or Open Mobile Alliance's (OMA's) Instant Messaging and Presence Service (IMPS)), Yahoo! Instant Messenger Service, and/or the like. The information server provides results in the form of Web pages to Web browsers, and allows for the manipulated generation of the Web pages through interaction with other program components. After a Domain Name System (DNS) resolution portion of an HTTP request is resolved to a particular information server, the information server resolves requests for information at specified locations on the MKT™ controller based on the remainder of the HTTP request. For example, a request such as http://123.124.125.126/myInformation.html might have the IP portion of the request "123.124.125.126" resolved by a DNS server to an information server at that IP address; that information server might in turn further parse the http request for the "/myInformation.html" portion of the request and resolve it to a location in memory containing the information "myInformation.html." Additionally, other information serving protocols may be employed across various ports, e.g., FTP communications across port 21, and/or the like. An information server may communicate to and/or with other components in a component collection, including itself, and/or facilities of the like. Most frequently, the information server communicates with the MKT™ database 619, operating systems, other program components, user interfaces, Web browsers, and/or the like.

Access to the MKT™ database may be achieved through a number of database bridge mechanisms such as through scripting languages as enumerated below (e.g., CGI) and through inter-application communication channels as enumerated below (e.g., CORBA, WebObjects, etc.). Any data requests through a Web browser are parsed through the bridge mechanism into appropriate grammars as required by the MKT™. In one embodiment, the information server would provide a Web form accessible by a Web browser. Entries made into supplied fields in the Web form are tagged as having been entered into the particular fields, and parsed as such. The entered terms are then passed along with the field tags, which act to instruct the parser to generate queries directed to appropriate tables and/or fields. In one embodiment, the parser may generate queries in standard SQL by instantiating a search string with the proper join/select commands based on the tagged text entries, wherein the resulting command is provided over the bridge mechanism to the MKT™ as a query. Upon generating query results from the query, the results are passed over the bridge mechanism, and may be parsed for formatting and generation of a new results Web page by the bridge mechanism. Such a new results Web page is then provided to the information server, which may supply it to the requesting Web browser.

Also, an information server may contain, communicate, generate, obtain, and/or provide program component, system, user, and/or data communications, requests, and/or responses.

User Interface

Computer interfaces in some respects are similar to automobile operation interfaces. Automobile operation interface elements such as steering wheels, gearshifts, and speedometers facilitate the access, operation, and display of automobile resources, and status. Computer interaction interface elements such as check boxes, cursors, menus, scrollers, and windows (collectively and commonly referred to as widgets) similarly facilitate the access, capabilities, operation, and display of data and computer hardware and operating system resources, and status. Operation interfaces are commonly called user interfaces. Graphical user interfaces (GUIs) such as the Apple Macintosh Operating System's Aqua, IBM's OS/2, Microsoft's Windows 2000/2003/3.1/95/98/CE/Millenium/NT/XP/Vista/7 (i.e., Aero), Unix's X-Windows (e.g., which may include additional Unix graphic interface libraries and layers such as K Desktop Environment (KDE), mythTV and GNU Network Object Model Environment (GNOME)), web interface libraries (e.g., ActiveX, AJAX, (D)HTML, FLASH, Java, JavaScript, etc. interface libraries such as, but not limited to, Dojo, jQuery(UI), MooTools, Prototype, script.aculo.us, SWFObject, Yahoo! User Interface, any of which may be used and) provide a baseline and means of accessing and displaying information graphically to users.

A user interface component 617 is a stored program component that is executed by a CPU. The user interface may be a conventional graphic user interface as provided by, with, and/or atop operating systems and/or operating environments such as already discussed. The user interface may allow for the display, execution, interaction, manipulation, and/or operation of program components and/or system facilities through textual and/or graphical facilities. The user interface provides a facility through which users may affect, interact, and/or operate a computer system. A user interface may communicate to and/or with other components in a component collection, including itself, and/or facilities of the like. Most frequently, the user interface communicates with operating systems, other program components, and/or the like. The user interface may contain, communicate, generate, obtain, and/or provide program component, system, user, and/or data communications, requests, and/or responses.

Web Browser

A Web browser component 618 is a stored program component that is executed by a CPU. The Web browser may be a conventional hypertext viewing application such as Microsoft Internet Explorer or Netscape Navigator. Secure Web browsing may be supplied with 128 bit (or greater) encryption by way of HTTPS, SSL, and/or the like. Web browsers allowing for the execution of program components through facilities such as ActiveX, AJAX, (D)HTML, FLASH, Java, JavaScript, web browser plug-in APIs (e.g., FireFox, Safari Plug-in, and/or the like APIs), and/or the like. Web browsers and like information access tools may be integrated into PDAs, cellular telephones, and/or other mobile devices. A Web browser may communicate to and/or with other components in a component collection, including itself, and/or facilities of the like. Most frequently, the Web browser communicates with information servers, operating systems, integrated program components (e.g., plug-ins), and/or the like; e.g., it may contain, communicate, generate, obtain, and/or provide program component, system, user, and/or data communications, requests, and/or responses. Of course, in place of a Web browser and information server, a combined application may be developed to perform similar functions of both. The combined application would similarly affect the obtaining and the provision of information to users, user agents, and/or the like from the MKT™ enabled nodes. The combined application may be nugatory on systems employing standard Web browsers.

Mail Server

A mail server component 621 is a stored program component that is executed by a CPU 603. The mail server may be a conventional Internet mail server such as, but not limited to sendmail, Microsoft Exchange, and/or the like. The mail server may allow for the execution of program components through facilities such as ASP, ActiveX, (ANSI) (Objective-) C (++), C# and/or .NET, CGI scripts, Java, JavaScript, PERL, PHP, pipes, Python, WebObjects, and/or the like. The mail server may support communications protocols such as, but not limited to: Internet message access protocol (IMAP), Messaging Application Programming Interface (MAPI)/Microsoft Exchange, post office protocol (POP3), simple mail transfer protocol (SMTP), and/or the like. The mail server can route, forward, and process incoming and outgoing mail messages that have been sent, relayed and/or otherwise traversing through and/or to the MKT™.

Access to the MKT™ mail may be achieved through a number of APIs offered by the individual Web server components and/or the operating system.

Also, a mail server may contain, communicate, generate, obtain, and/or provide program component, system, user, and/or data communications, requests, information, and/or responses.

Mail Client

A mail client component 622 is a stored program component that is executed by a CPU 603. The mail client may be a conventional mail viewing application such as Apple Mail, Microsoft Entourage, Microsoft Outlook, Microsoft Outlook Express, Mozilla, Thunderbird, and/or the like. Mail clients may support a number of transfer protocols, such as: IMAP, Microsoft Exchange, POP3, SMTP, and/or the like. A mail client may communicate to and/or with other components in a component collection, including itself, and/or facilities of the like. Most frequently, the mail client communicates with mail servers, operating systems, other mail clients, and/or the like; e.g., it may contain, communicate, generate, obtain, and/or provide program component, system, user, and/or data communications, requests, information, and/or responses. Generally, the mail client provides a facility to compose and transmit electronic mail messages.

Cryptographic Server

A cryptographic server component 620 is a stored program component that is executed by a CPU 603, cryptographic processor 626, cryptographic processor interface 627, cryptographic processor device 628, and/or the like. Cryptographic processor interfaces will allow for expedition of encryption and/or decryption requests by the cryptographic component; however, the cryptographic component, alternatively, may run on a conventional CPU. The cryptographic component allows for the encryption and/or decryption of provided data. The cryptographic component allows for both symmetric and asymmetric (e.g., Pretty Good Protection (PGP)) encryption and/or decryption. The cryptographic component may employ cryptographic techniques such as, but not limited to: digital certificates (e.g., X.509 authentication framework), digital signatures, dual signatures, enveloping, password access protection, public key management, and/or the like. The cryptographic component will facilitate numerous (encryption and/or decryption) security protocols such as, but not limited to: checksum, Data Encryption Standard (DES), Elliptical Curve Encryption (ECC), International Data Encryption Algorithm (IDEA), Message Digest 5 (MD5, which is a one way hash function), passwords, Rivest Cipher (RC5), Rijndael, RSA (which is an Internet encryption and authentication system that uses an algorithm developed in 1977 by Ron Rivest, Adi Shamir, and Leonard Adleman), Secure Hash Algorithm (SHA), Secure Socket Layer (SSL), Secure Hypertext Transfer Protocol (HTTPS), and/or the like. Employing such encryption security protocols, the MKT™ may encrypt all incoming and/or outgoing communications and may serve as node within a virtual private network (VPN) with a wider communications network. The cryptographic component facilitates the process of "security authorization" whereby access to a resource is inhibited by a security protocol wherein the cryptographic component effects authorized access to the secured resource. In addition, the cryptographic component may provide unique identifiers of content, e.g., employing and MD5 hash to obtain a unique signature for an digital audio file. A cryptographic component may communicate to and/or with other components in a component collection, including itself, and/or facilities of the like. The cryptographic component supports encryption schemes allowing for the secure transmission of information across a communications network to enable the MKT™ component to engage in secure transactions if so desired. The cryptographic component facilitates the secure accessing of resources on the MKT™ and facilitates the access of secured resources on remote systems; i.e., it may act as a client and/or server of secured resources. Most frequently, the cryptographic component communicates with information servers, operating systems, other program components, and/or the like. The cryptographic component may contain, communicate, generate, obtain, and/or provide program component, system, user, and/or data communications, requests, and/or responses.

The MKT™ Database

The MKT™ database component 619 may be embodied in a database and its stored data. The database is a stored program component, which is executed by the CPU; the stored program component portion configuring the CPU to process the stored data. The database may be a conventional, fault tolerant, relational, scalable, secure database such as Oracle or Sybase. Relational databases are an extension of a flat file. Relational databases consist of a series of related tables. The tables are interconnected via a key field. Use of the key field allows the combination of the tables by indexing against the key field; i.e., the key fields act as dimensional pivot points for combining information from various tables. Relationships generally identify links maintained between tables by matching primary keys. Primary keys represent fields that uniquely identify the rows of a table in a relational database. More precisely, they uniquely identify rows of a table on the "one" side of a one-to-many relationship.

Alternatively, the MKT™ database may be implemented using various standard data-structures, such as an array, hash, (linked) list, struct, structured text file (e.g., XML), table, and/or the like. Such data-structures may be stored in memory and/or in (structured) files. In another alternative, an object-oriented database may be used, such as Frontier, ObjectStore, Poet, Zope, and/or the like. Object databases can include a number of object collections that are grouped and/or linked together by common attributes; they may be related to other object collections by some common attributes. Object-oriented databases perform similarly to relational databases with the exception that objects are not just pieces of data but may have other types of functionality encapsulated within a given object. If the MKT™ database is implemented as a data-structure, the use of the MKT™ database 619 may be integrated into another component such as the MKT™ component 635. Also, the database may be implemented as a mix of data structures, objects, and relational structures. Databases may be consolidated and/or distributed in countless variations through standard data processing techniques. Portions of databases, e.g., tables, may be exported and/or imported and thus decentralized and/or integrated.

In one embodiment, the database component 619 includes several tables 619*a-j*. A Users (e.g., operators and physicians) table 619*a* may include fields such as, but not limited to: user_id, ssn, dob, first_name, last_name, age, state, address_firstline, address_secondline, zipcode, devices_list, contact_info, contact_type, alt_contact_info, alt_contact_type, and/or the like to refer to any type of enterable data or selections discussed herein. The Users table may support and/or track multiple entity accounts. A Clients table 619*b* may include fields such as, but not limited to: user_id, client_id, client_ip, client_type, client_model, operating_system, os_version, app_installed_flag, and/or the like. An Apps table 619*c* may include fields such as, but not limited to: app_ID, app_name, app_type, OS_compatibilities_list, version, timestamp, developer_ID, and/or the like. A Patients table for patients associated with an entity administering the magnetic resonance system 619*d* may include fields such as, but not limited to: patient_id, patient_name, patient_address, ip_address, mac_address, auth_key, port_num, security_settings_list, and/or the like. An MR Studies table 619*e* may include fields such as, but not limited to: study_id, study_name, security_settings_list, study_parameters, rf_sequences, gradient_sequences, coil_selection, imaging_mode, and/or the like. An RF sequences table 619*f* including a plurality of different rf pulse sequences may include fields such as, but not limited to: sequence_type, sequence_id, tip_angle, coil_selection, power_level, and/or the like. A gradient sequences table 619*g* may include fields relating to different gradient field sequences such as, but not limited to: sequence_id, Gx, Gy, Gz, Gxy, Gxz, Gyz, Gxyz, field_strength, time_duration, and/or the like. A raw MR data table 619*h* may include fields such as, but not limited to: study_id, time_stamp, file_size, patient_id, rf_sequence, body_part_imaged, slice_id, and/or the like. A Images table 619*i* may include fields such as, but not limited to: image_id, study_id, file_size, patient_id, time_stamp, settings, and/or the like. A Payment Legers table 619*j* may include fields such as, but not limited to: request_id, timestamp, payment_amount, batch_id, transaction_id, clear_flag, deposit_account, transaction_summary, patient_name, patient_account, and/or the like.

In one embodiment, user programs may contain various user interface primitives, which may serve to update the MKT™ platform. Also, various accounts may require custom database tables depending upon the environments and the types of clients the MKT™ system may need to serve. It should be noted that any unique fields may be designated as a key field throughout. In an alternative embodiment, these tables have been decentralized into their own databases and their respective database controllers (i.e., individual database controllers for each of the above tables). Employing standard data processing techniques, one may further distribute the databases over several computer systemizations and/or storage devices. Similarly, configurations of the decentralized database controllers may be varied by consolidating and/or distributing the various database components 619*a-j*. The MKT™ system may be configured to keep track of various settings, inputs, and parameters via database controllers.

The MKT™ database may communicate to and/or with other components in a component collection, including itself, and/or facilities of the like. Most frequently, the MKT™ database communicates with the MKT™ component, other program components, and/or the like. The database may contain, retain, and provide information regarding other nodes and data.

The MKT™ Components

The MKT™ component 635 is a stored program component that is executed by a CPU. In one embodiment, the MKT™ component incorporates any and/or all combinations of the aspects of the MKT™ systems discussed in the previous figures. As such, the MKT™ component affects accessing, obtaining and the provision of information, services, transactions, and/or the like across various communications networks.

The MKT™ component may transform raw data collected by the magnetic resonance system into at least one of (i) an image, (ii) dynamic flow data, (iii) perfusion data, (iii) spectroscopic identity of chemical species, (iv) physiological data, or (v) metabolic data, among other things. In one embodiment, the MKT™ component 635 takes inputs (e.g., digitized representations of $M_{XY}$ signals produced by RD or SR pulses, and transforms the inputs via various components of the system, into outputs (e.g., (i) an image, (ii) dynamic flow data, (iii) perfusion data, (iii) spectroscopic identity of chemical species, (iv) physiological data, or (v) metabolic data, among other things).

The MKT™ component enabling access of information between nodes may be developed by employing standard development tools and languages such as, but not limited to: Apache components, Assembly, ActiveX, binary executables, (ANSI) (Objective-) C (++), C# and/or .NET, database adapters, CGI scripts, Java, JavaScript, mapping tools, procedural and object oriented development tools, PERL, PHP, Python, shell scripts, SQL commands, web application server extensions, web development environments and libraries (e.g., Microsoft's ActiveX; Adobe AIR, FLEX & FLASH; AJAX; (D)HTML; Dojo, Java; JavaScript; jQuery(UI); MooTools; Prototype; script.aculo.us; Simple Object Access Protocol (SOAP); SWFObject; Yahoo! User Interface; and/or the like), WebObjects, and/or the like. In one embodiment, the MKT™ server employs a cryptographic server to encrypt and decrypt communications. The MKT™ component may communicate to and/or with other components in a component collection, including itself, and/or facilities of the like. Most frequently, the MKT™ component communicates with the MKT™ database, operating systems, other program components, and/or the like. The MKT™ may contain, communicate, generate, obtain, and/or provide program component, system, user, and/or data communications, requests, and/or responses.

Distributed MKT™ Embodiments

The structure and/or operation of any of the MKT™ node controller components may be combined, consolidated, and/or distributed in any number of ways to facilitate development and/or deployment. Similarly, the component collection may be combined in any number of ways to facilitate deployment and/or development. To accomplish this, one may integrate the components into a common code base or in a facility that can dynamically load the components on demand in an integrated fashion.

The component collection may be consolidated and/or distributed in countless variations through standard data processing and/or development techniques. Multiple instances of any one of the program components in the program component collection may be instantiated on a single node, and/or across numerous nodes to improve performance through load-balancing and/or data-processing techniques. Furthermore, single instances may also be distributed across multiple controllers and/or storage devices; e.g., databases. All program component instances and controllers working in concert may do so through standard data processing communication techniques.

The configuration of the MKT™ controller will depend on the context of system deployment. Factors such as, but not limited to, the budget, capacity, location, and/or use of the underlying hardware resources may affect deployment requirements and configuration. Regardless of if the configuration results in more consolidated and/or integrated program components, results in a more distributed series of program components, and/or results in some combination between a consolidated and distributed configuration, data may be communicated, obtained, and/or provided. Instances of components consolidated into a common code base from the program component collection may communicate, obtain, and/or provide data. This may be accomplished through intra-application data processing communication techniques such as, but not limited to: data referencing (e.g., pointers), internal messaging, object instance variable communication, shared memory space, variable passing, and/or the like.

If component collection components are discrete, separate, and/or external to one another, then communicating, obtaining, and/or providing data with and/or to other component components may be accomplished through inter-application data processing communication techniques such as, but not limited to: Application Program Interfaces (API) information passage; (distributed) Component Object Model ((D)COM), (Distributed) Object Linking and Embedding ((D)OLE), and/or the like), Common Object Request Broker Architecture (CORBA), Jini local and remote application program interfaces, JavaScript Object Notation (JSON), Remote Method Invocation (RMI), SOAP, process pipes, shared files, and/or the like. Messages sent between discrete component components for inter-application communication or within memory spaces of a singular component for intra-application communication may be facilitated through the creation and parsing of a grammar. A grammar may be developed by using development tools such as lex, yacc, XML, and/or the like, which allow for grammar generation and parsing capabilities, which in turn may form the basis of communication messages within and between components.

For example, a grammar may be arranged to recognize the tokens of an HTTP post command, e.g.:

w3c-post http:// . . . Value1 where Value1 is discerned as being a parameter because "http://" is part of the grammar syntax, and what follows is considered part of the post value. Similarly, with such a grammar, a variable "Value1" may be inserted into an "http://" post command and then sent. The grammar syntax itself may be presented as structured data that is interpreted and/or otherwise used to generate the parsing mechanism (e.g., a syntax description text file as processed by lex, yacc, etc.). Also, once the parsing mechanism is generated and/or instantiated, it itself may process and/or parse structured data such as, but not limited to: character (e.g., tab) delineated text, HTML, structured text streams, XML, and/or the like structured data. In another embodiment, inter-application data processing protocols themselves may have integrated and/or readily available parsers (e.g., JSON, SOAP, and/or like parsers) that may be employed to parse (e.g., communications) data. Further, the parsing grammar may be used beyond message parsing, but may also be used to parse: databases, data collections, data stores, structured data, and/or the like. Again, the desired configuration will depend upon the context, environment, and requirements of system deployment.

For example, in some implementations, the MKT™ controller may be executing a PHP script implementing a Secure Sockets Layer ("SSL") socket server via the information server, which listens to incoming communications on a server port to which a client may send data, e.g., data encoded in JSON format. Upon identifying an incoming communication, the PHP script may read the incoming message from the client device, parse the received JSON-encoded text data to extract information from the JSON-encoded text data into PHP script variables, and store the data (e.g., client identifying information, etc.) and/or extracted information in a relational database accessible using the Structured Query Language ("SQL"). An exemplary listing, written substantially in the form of PHP/SQL commands, to accept JSON-encoded input data from a client device via a SSL connection, parse the data to extract variables, and store the data to a database, is provided below:

```
<?PHP
header('Content-Type: text/plain');
// set ip address and port to listen to for incoming data
$address = '192.168.0.100';
$port = 255;
// create a server-side SSL socket, listen for/accept incoming communication
$sock = socket_create(AF_INET, SOCK_STREAM, o);
socket_bind($sock, $address, $port) or die('Could not bind to address');
socket_listen($sock);
$client = socket_accept($sock);
// read input data from client device in 1024 byte blocks until end of message
do {
    $input = "";
    $input = socket_read($client, 1024);
    $data .= $input;
} while($input != "");
// parse data to extract variables
$obj = json_decode($data, true);
// store input data in a database
mysql_connect("201.408.185.132",$DBserver,$password); // access database server
mysql_select("CLIENT_DB.SQL"); // select database to append
mysql_query("INSERT INTO UserTable (transmission) VALUES ($data)"); // add data to UserTable table in a CLIENT database
mysql_close("CLIENT_DB.SQL"); // close connection to database
?>
```

Also, the following resources may be used to provide example embodiments regarding SOAP parser implementation:

http://www.xav.com/perl/site/lib/SOAP/Parser.html
http://publib.boulder.ibm.com/infocenter/tivihelp/v2r1/index.jsp?topic=/com.i
bm.IBMDI.doc/referenceguide295.htm and other parser implementations:

http://publib.boulder.ibm.com/infocenter/tivihelp/v2r1/index.jsp?topic=/com.i
bm.IBMDI.doc/referenceguide259.htm all of which are hereby expressly incorporated by reference.

In order to address various issues and advance the art, the entirety of this application for MKT™ APPARATUSES, METHODS AND SYSTEMS (including the Cover Page, Title, Headings, Field, Background, Summary, Brief Description of the Drawings, Detailed Description, Claims, Abstract, Figures, Appendices and/or otherwise) shows by way of illustration various embodiments in which the disclosed embodiments may be practiced. The advantages and features of the application are of a representative sample of embodiments only, and are not exhaustive and/or exclusive. They are presented only to assist in understanding and teach the claimed principles. It should be understood that they are not representative of all disclosed embodiments. As such, certain aspects of the disclosure have not been discussed herein. That alternate embodiments may not have been presented for a specific portion of the disclosure or that further undescribed alternate embodiments may be available for a portion is not to be considered a disclaimer of those alternate embodiments. It will be appreciated that many of those undescribed embodiments incorporate the same principles of the disclosure and others are equivalent. Thus, it is to be understood that other embodiments may be utilized and functional, logical, organizational, structural and/or topological modifications may be made without departing from the scope and/or spirit of the disclosure. As such, all examples and/or embodiments are deemed to be non-limiting throughout this disclosure. Also, no inference should be drawn regarding those embodiments discussed herein relative to those not discussed herein other than it is as such for purposes of reducing space and repetition. For instance, it is to be understood that the logical and/or topological structure of any combination of any program components (a component collection), other components and/or any present feature sets as described in the figures and/or throughout are not limited to a fixed operating order and/or arrangement, but rather, any disclosed order is exemplary and all equivalents, regardless of order, are contemplated by the disclosure. Furthermore, it is to be understood that such features are not limited to serial execution, but rather, any number of threads, processes, services, servers, and/or the like that may execute asynchronously, concurrently, in parallel, simultaneously, synchronously, and/or the like are contemplated by the disclosure. As such, some of these features may be mutually contradictory, in that they cannot be simultaneously present in a single embodiment. Similarly, some features are applicable to one aspect of the disclosure, and inapplicable to others. In addition, the disclosure includes other embodiments not presently claimed. Applicant reserves all rights in those presently unclaimed embodiments including the right to claim such embodiments, file additional applications, continuations, continuations in part, divisions, and/or the like thereof. As such, it should be understood that advantages, embodiments, examples, functional, features, logical, organizational, structural, topological, and/or other aspects of the disclosure are not to be considered limitations on the disclosure as defined by the claims or limitations on equivalents to the claims. It is to be understood that, depending on the particular needs and/or characteristics of a MKT™ individual and/or enterprise user, database configuration and/or relational model, data type, data transmission and/or network framework, syntax structure, and/or the like, various embodiments of the MKT™ may be implemented that enable a great deal of flexibility and customization.

All statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Descriptions herein of circuitry and method steps and computer programs represent conceptual embodiments of illustrative circuitry and software embodying the principles of the disclosed embodiments. Thus the functions of the various elements shown and described herein may be provided through the use of dedicated hardware as well as hardware capable of executing software in association with appropriate software as set forth herein.

In the disclosure hereof any element expressed as a means for performing a specified function is intended to encompass any way of performing that function including, for example, a) a combination of circuit elements and associated hardware which perform that function or b) software in any form, including, therefore, firmware, microcode or the like as set forth herein, combined with appropriate circuitry for executing that software to perform the function. Applicants thus regard any means which can provide those functionalities as equivalent to those shown herein.

Similarly, it will be appreciated that the system and process flows described herein represent various processes which may be substantially represented in computer-readable media and so executed by a computer or processor, whether or not such computer or processor is explicitly shown. Moreover, the various processes can be understood as representing not only processing and/or other functions but, alternatively, as blocks of program code that carry out such processing or functions.

The methods, systems, computer programs and mobile devices of the present disclosure, as described above and shown in the drawings, among other things, provide for improved magnetic resonance methods, systems and machine readable programs for carrying out the same. It will be apparent to those skilled in the art that various modifications and variations can be made in the devices, methods, software programs and mobile devices of the present disclosure without departing from the spirit or scope of the disclosure. Thus, it is intended that the present disclosure include modifications and variations that are within the scope of the subject disclosure and equivalents.

What is claimed is:

1. A method for performing magnetic resonance spectroscopic imaging comprising:
   a) providing a magnetic resonance device including (i) a main magnet for providing a background magnetic field along a first direction, (ii) at least one radio-frequency coil configured to resonate with the Larmor frequency of $^{19}$F, and (iii) at least one gradient coil configured to be controlled to define a region of interest;
   b) positioning a supplemental spin reservoir within a field of view of the at least one resonant coil, the supplemental spin reservoir (SSR) including a plurality of molecules, at least some of the molecules including $^{19}$F;
   c) administering a composition including at least one biomarker or precursor of a biomarker molecule including $^{19}$F to a sample or a subject to be imaged;
   d) introducing the sample or the subject to be studied into the field of view;
   e) introducing RF pulses into the sample or subject;
   f) collecting three dimensional spatial data for a set of nuclei of interest including $^{19}$F from at least one of the (i) sample or subject, and (ii) the SSR;
   g) after step (f), inducing feedback between the nuclear magnetization of the set of nuclei of interest and the at least one radio frequency coil to cause the vector direction of the nuclear magnetization of the set of nuclei of interest to rotate to a desired angle.

2. The method of claim 1, wherein the vector direction of the nuclear magnetization of the set of nuclei of interest is rotated substantially to zero.

3. The method of claim 1, further comprising repeating steps (e), (f) and (g) until sufficient three dimensional spatial data of the set of nuclei of interest has been obtained in order to produce a useful rendering of the spatial data.

4. The method of claim 1, wherein a first radio frequency coil is used to introduce RF pulses into the sample or subject, and a second radio frequency coil is used to induce electromagnetic feedback between the nuclear magnetization of the set of nuclei of interest and the second radio frequency coil.

5. The method of claim 1, further comprising collecting three dimensional spatial data of $^{1}$H in the region of interest.

6. The method of Claim 5, further comprising combining and processing the $^{1}$H spatial data with the spatial data of the set of nuclei of interest.

7. The method of claim 6, further comprising forming a 3D image rendering of the region of interest using the $^{1}$H spatial data and the spatial data of the set of nuclei of interest.

8. The method of Claim 7, wherein the 3D rendering illustrates a distribution of the nuclei of interest in an anatomical region.

9. The method of Claim 1, wherein the biomarker includes $^{19}$F.

10. The method of Claim 9, wherein the method further comprises administering a beneficial agent including $^{19}$F-FDG to the subject before imaging.

11. The method of Claim 10, wherein the method further comprises analyzing data obtained from the signal indicative of the presence of $^{19}$F-FDG or at least one of its metabolites in the subject to facilitate the identification of symptoms of a disorder in the subject.

12. The method of claim 9, wherein the biomarker includes a metabolite of $^{19}$F-fluorodeoxyglucose.

13. The method of claim 12, wherein the set of nuclei of interest includes $^{19}$F-FDG-6-phosphate.

14. The method of claim 1, wherein feedback is induced by adjusting the circuitry of the at least one radio frequency coil.

15. The method of claim 1, wherein feedback is induced by adjusting the contents of the SSR.

16. The method of claim 1, further comprising suppressing or destroying the magnetization of molecules including $^{19}$F in the SSR.

17. The method of claim 16, wherein the magnetization of molecules including $^{19}$F in the SSR is suppressed or destroyed before collecting the three dimensional spatial data.

18. The method of claim 1, further comprising introducing RF pulses into the SSR.

19. A method for performing magnetic resonance spectroscopic imaging comprising:
   a) providing a magnetic resonance device including (i) a main magnet for providing a background magnetic field along a first direction, (ii) at least one radio-frequency coil configured to resonate with the Larmor frequency of $^{19}$F, and (iii) at least one gradient coil configured to be controlled to define a region of interest;
   b) positioning a supplemental spin reservoir within a field of view of the at least one resonant coil, the supplemental spin reservoir (SSR) including a plurality of molecules, at least some of the molecules including $^{19}$F;
   c) administering a composition including at least one biomarker or precursor of a biomarker molecule including $^{19}$F to a sample or a subject to be imaged;
   d) introducing a sample or subject to be studied into the region of interest;
   e) introducing RF pulses into the sample or subject;
   f) inducing feedback between the nuclear magnetization of the set of nuclei of interest and the at least one radio frequency coil to cause the vector direction of the nuclear magnetization of the set of nuclei of interest to 90 degrees; and
   g) after step (f), collecting three dimensional spatial data for a set of nuclei of interest including $^{19}$F from at least one of the (i) sample or subject, and (ii) the SSR.

20. The method of claim 19, further comprising collecting three dimensional spatial data for a set of nuclei of interest from at least one of the (i) sample or subject, and (ii) the SSR.

21. The method of claim 20, wherein a first radio frequency coil is used to introduce RF pulses into the sample or subject, and a second radio frequency coil is used to induce electromagnetic feedback between the nuclear magnetization of the set of nuclei of interest including $^{19}$F and the second radio frequency coil.

22. The method of Claim 20, further comprising collecting three dimensional spatial data of $^{1}$H in the region of interest.

23. The method of Claim 20, further comprising combining and processing the $^1$H spatial data with the spatial data of the set of nuclei of interest.

24. The method of claim 19, further comprising repeating steps (e), (f) and (g) until sufficient three dimensional spatial data of the set of nuclei of interest has been obtained in order to produce a useful rendering of the spatial data.

25. The method of claim 19, wherein feedback is induced by adjusting the circuitry of the at least one radio frequency coil.

26. The method of claim 19, wherein feedback is induced by adjusting the contents of the SSR.

27. The method of claim 19, further comprising suppressing or destroying the magnetization of molecules including $^{19}$F in the SSR.

28. The method of claim 27, wherein the magnetization of molecules including $^{19}$F in the SSR is suppressed or destroyed before collecting the three dimensional spatial data.

29. The method of claim 19, further comprising introducing RF pulses into the SSR.

\* \* \* \* \*